United States Patent
Dang

(10) Patent No.: US 10,132,854 B2
(45) Date of Patent: Nov. 20, 2018

(54) SYSTEMS AND METHODS FOR EVALUATING INSULATION OF FORMED WIRE OR WIRES

(71) Applicant: Faraday & Future Inc., Gardena, CA (US)

(72) Inventor: Dang Dinh Dang, Garden Grove, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 102 days.

(21) Appl. No.: 15/277,813

(22) Filed: Sep. 27, 2016

(65) Prior Publication Data

US 2018/0088168 A1    Mar. 29, 2018

(51) Int. Cl.
| | |
|---|---|
| *G01R 31/12* | (2006.01) |
| *H02K 3/30* | (2006.01) |
| *G01R 31/44* | (2006.01) |
| *H02K 15/04* | (2006.01) |
| *H02K 15/12* | (2006.01) |

(52) U.S. Cl.
CPC ......... *G01R 31/1272* (2013.01); *G01R 31/44* (2013.01); *H02K 3/30* (2013.01); *H02K 15/0478* (2013.01); *H02K 15/12* (2013.01)

(58) Field of Classification Search
CPC ... G01R 31/34; G01R 31/346; G01R 31/1272
See application file for complete search history.

(56) References Cited

U.S. PATENT DOCUMENTS

| | | | | |
|---|---|---|---|---|
| 7,806,780 | B1* | 10/2010 | Plunkett | A63B 69/3641 473/229 |
| 2014/0368233 | A1* | 12/2014 | Perry | G01R 31/346 324/765.01 |
| 2016/0141943 | A1* | 5/2016 | Magri | H02K 15/0414 29/593 |

FOREIGN PATENT DOCUMENTS

JP       2014135819 A   *   7/2014

* cited by examiner

*Primary Examiner* — Walter L Lindsay, Jr.
*Assistant Examiner* — Milton Gonzalez
(74) *Attorney, Agent, or Firm* — Knobbe Martens Olson & Bear LLP

(57) ABSTRACT

Systems and methods to evaluate insulation-covered stator wire are disclosed. The stator wire includes a conductor having a plurality of bent segments connected by a plurality of unbent segments, and an electrically insulating coating applied to portions of the segments. Systems and methods include translating an electrically conductive brush over one or more of the plurality of bent segments of the stator wire. Systems and methods include measuring a change in electrical current between the electrically conductive brush and an uninsulated end of the conductor when the electrically conductive brush contacts the conductor in a portion of the one or more plurality of bent segments comprising a defect in the electrically insulating coating.

20 Claims, 23 Drawing Sheets

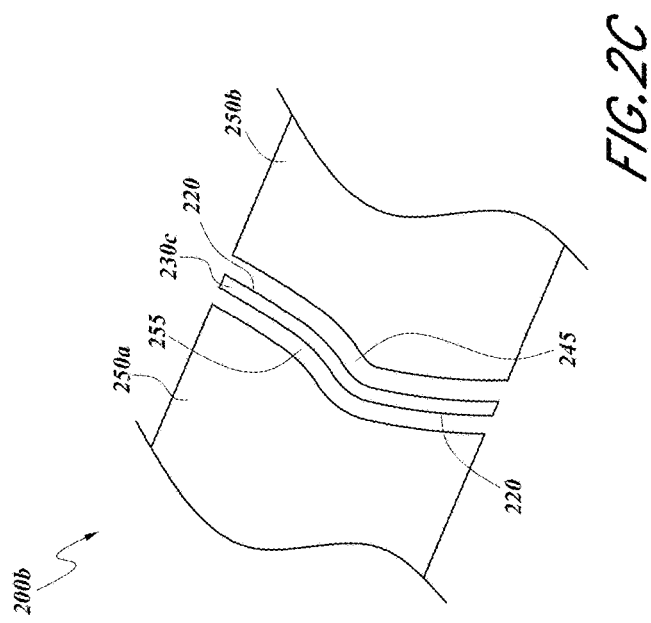

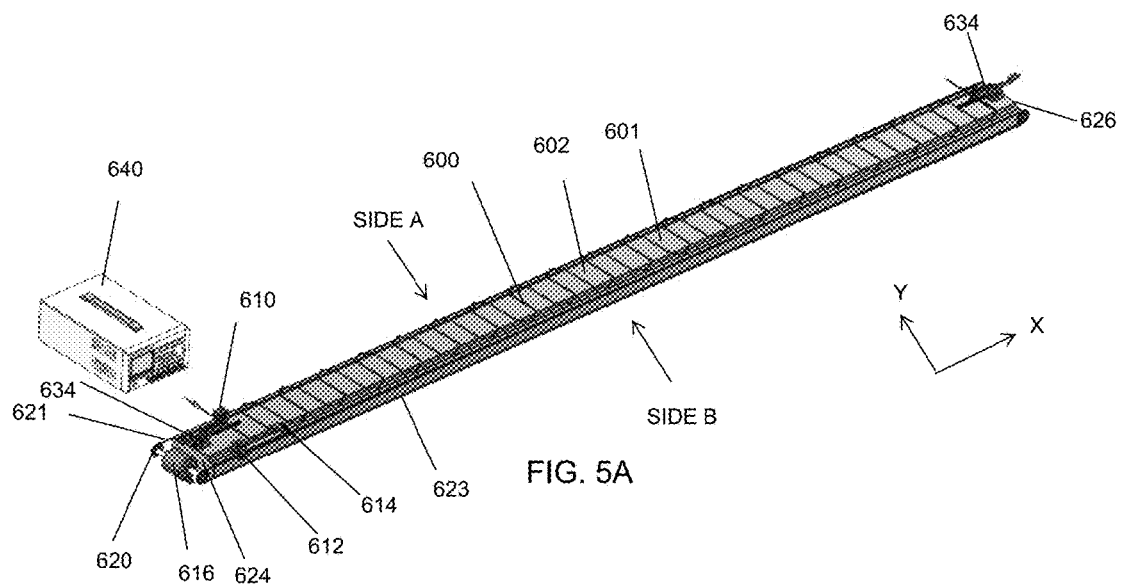

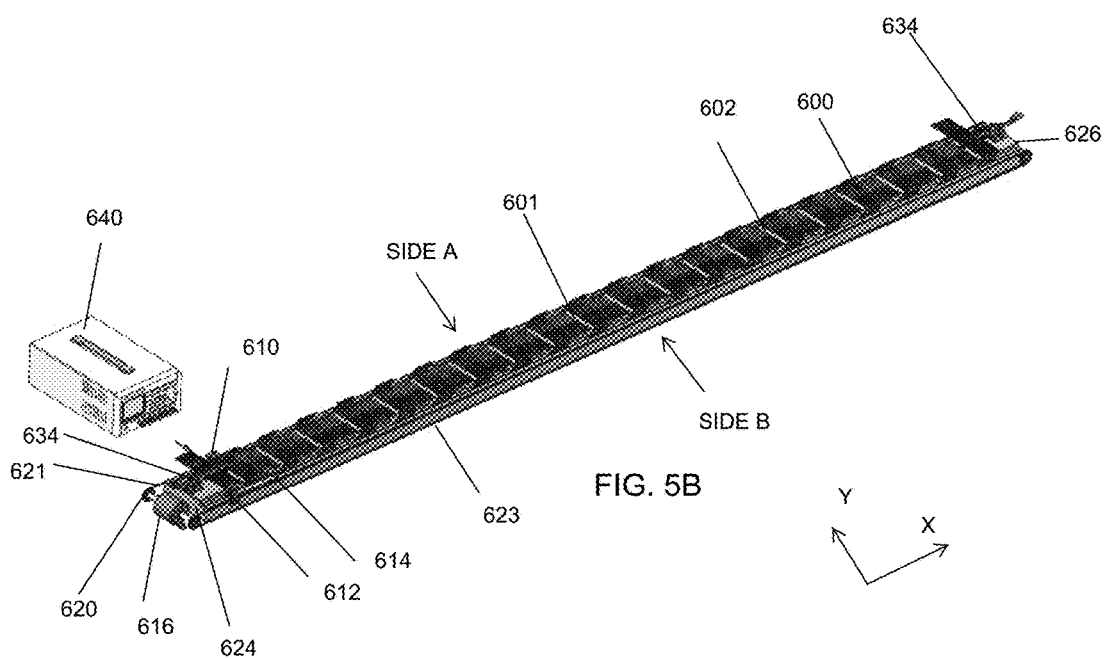

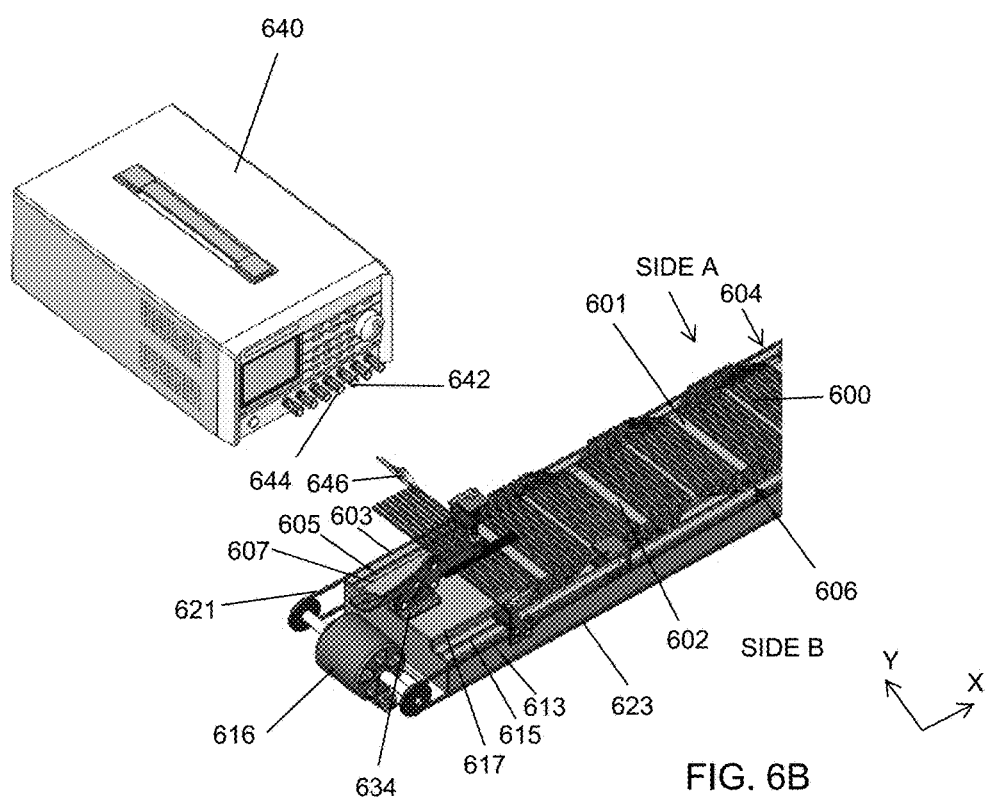

SYSTEMS AND METHODS FOR EVALUATING INSULATION OF FORMED WIRE OR WIRES

TECHNICAL FIELD

The systems and methods disclosed herein are directed toward evaluating the electrically insulating coating of a formed wire or wires, in particular formed wire or wires of continuous stator windings for an electrical machine.

BACKGROUND

Electrical machines include both electric motors and electric generators. In recent years, high efficiency electric motors have become desirable to meet the challenges of providing power without the usage of fossil fuel sources, for example in hybrid and electric vehicles. Interior permanent magnet (IPM) motors have become popular due to their high efficiency performance, as IPM electric machines have become increasingly efficient synchronous motors due to advances in high-energy permanent magnet technology, smart inverters, and digital controllers. IPM electric machines have magnets built into the interior of the rotor. The rotor is rotatable within a stator which includes multiple windings to produce a rotating magnetic field in the frame of reference of the stator.

SUMMARY

The systems and methods for evaluating the electrically insulating coating of formed wire or wires described herein have several features, no single one of which is solely responsible for their desirable attributes. Without limiting the scope as expressed by the claims that follow, the more prominent features of the systems and methods will now be discussed briefly. After considering this discussion, and particularly after reading the section entitled "Detailed Description" one will understand how the features of the systems and methods provide several advantages over traditional systems and methods of evaluation.

In some embodiments, a system for evaluating insulation-covered stator wire is provided. The system can include a continuous stator wire comprising: at least one conductor shaped into a plurality of bent segments connected by a plurality of unbent segments, and an electrically insulating coating applied to portions of the plurality of bent segments and the plurality of unbent segments. The system can include an electrically conductive brush configured to translate over one or more of the plurality of bent segments of the stator wire. The system can include a power supply establishing an electrical current between the electrically conductive brush and an uninsulated end of the at least one conductor, wherein the electrical current changes when the electrically conductive brush contacts the conductor in a portion of the one or more plurality of bent segments comprising a defect in the electrically insulating coating.

In some embodiments, the defect comprises one of a crack in the electrically insulating coating, a variation in the thickness of the electrically insulating coating, bubbles in the electrically insulating coating, and particulates in the electrically insulating coating. In some embodiments, the stator wire comprises a longitudinal axis extending in an x-axis direction, the stator wire further comprising a first plurality of bent segments on a first side of the longitudinal axis and a second plurality of bent segments on a second, opposing side of the longitudinal axis. In some embodiments, the brush is configured to translate in the x-axis direction and sequentially contact each of a plurality of consecutive bent segments in the first plurality of bent segments of the stator wire. The system can include a second electrically conductive brush configured to translate in the x-direction and sequentially contact each of a plurality of consecutive bent segments in the second plurality of bent segments of the stator wire, wherein the power supply is configured to establish an electrical current between the electrically conductive brushes and the uninsulated end of the conductor, and wherein the electrical current changes when either of the electrically conductive brushes contacts a portion comprising a defect in the electrically insulating coating. The system can include a processor configured to compare a measured electrical current between the electrically conductive brush and the uninsulated end of the conductor when the brush contacts the portion comprising the defect to a reference electrical current to determine the change in electrical current. The system can include a pulley-and-belt configured to translate the brush in the x-direction. In some embodiments, the brush comprises two opposing non-contacting bristle portions configured to sweep over a top side and a bottom side of the one or more of the plurality of bent segments of the stator wire. The system can include a second continuous stator wire positioned over the first stator wire in a z-axis direction and offset from the first stator wire in an x-axis direction, wherein the brush contacts each of a plurality of consecutive bent segments of the first stator wire and each of a plurality of consecutive bent segments of the second stator wire as the brush translates in the x-axis direction.

In some embodiments, a method of detecting defects in insulation-covered stator wire is provided. The method can include the step of providing at least one continuous stator wire comprising at least one conductor shaped into a plurality of bent segments connected by a plurality of unbent segments, and an electrically insulating coating applied to portions of the plurality of bent segments and the plurality of unbent segments of the conductor. The method can include the step of establishing an electrical current between an uninsulated end of the conductor and an electrically conductive brush. The method can include the step of translating the brush over one or more of the plurality of bent segments of the stator wire. The method can include the step of detecting a change in the electrical current between the uninsulated end of the conductor and the brush when the brush contacts conductor in a portion of the one or more plurality of bent segments comprising a defect in the electrically insulating coating.

In some embodiments, the defect comprises one of a crack in the electrically insulating coating, a variation in the thickness of the electrically insulating coating, bubbles in the electrically insulating coating, and particulates in the electrically insulating coating. In some embodiments, translating the brush comprises sequentially contacting the brush with each of a plurality of consecutive bent segments in a first plurality of bent segments of the stator wire. The method can include the step of establishing an electrical current between an uninsulated end of the conductor and a plurality of electrically conductive brushes, and further comprising simultaneously translating the plurality of electrically conductive brushes over one or more of the plurality of bent segments of the stator wire. In some embodiments, detecting a change in the electrical current comprises comparing a measured electrical current between the brush and the uninsulated end of the conductor when the brush contacts the portion comprising the defect to a reference electrical current. In some embodiments, a plurality of continuous stator wires are positioned over the first continuous stator wire in a z-axis direction. The method can include the step of simultaneously establishing an electrical current between uninsulated ends of all the conductors of the plurality of continuous stator wires and the brush. The method can include the step of translating the brush over a plurality of consecutive bent segments of the plurality of continuous stator wires. The method can include the step of detecting a change in the electrical current between the uninsulated end of at least one conductor and the brush when the brush contacts a portion of the electrically-connected stator wire that comprises a defect in electrically insulating coating.

In some embodiments, a system for detecting a defect in insulation-covered stator wire is provided. The system can include a first conductor. The system can include at least one continuous stator wire comprising at least one second conductor shaped into a plurality of bent segments connected by a plurality of unbent segments, and an electrically insulating coating applied to portions of the plurality of bent segments and the plurality of unbent segments of the conductor. The system can include means for translating the first conductor over one or more of the plurality of bent segments of the stator wire. The system can include a power supply establishing an electrical current between the first conductor and an uninsulated end of the at least one second conductor, wherein the electrical current changes when the first conductor contacts the second conductor in a portion of the one or more plurality of bent segments comprising a defect in the electrically insulating coating.

In some embodiments, the first conductor comprises at least one of a bristle, a brush, a fiber, a woven cloth, and a non-woven cloth. In some embodiments, the means for translating comprises a pulley-and-belt. In some embodiments, the means for translating comprises a motor configured to translate a carriage comprising the first conductor. In some embodiments, the stator wire is positioned on a first surface of a test platform, and wherein the means for translating comprises a groove in a second surface of the test platform, the groove coupled to a carriage having the first conductor attached thereto.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

FIG. 2C illustrates a top view of the crown of the continuous winding of FIG. 2A and example molds for forming a second bend of the crown.

FIG. 5A illustrates a system for use with the formed wire of FIG. 4A and FIG. 5B illustrates a system for use with the formed wires of FIG. 4B.

FIG. 6A-6B illustrate the systems connected to a high potential ("hipot") tester.

DETAILED DESCRIPTION

Introduction

Figure 1A:
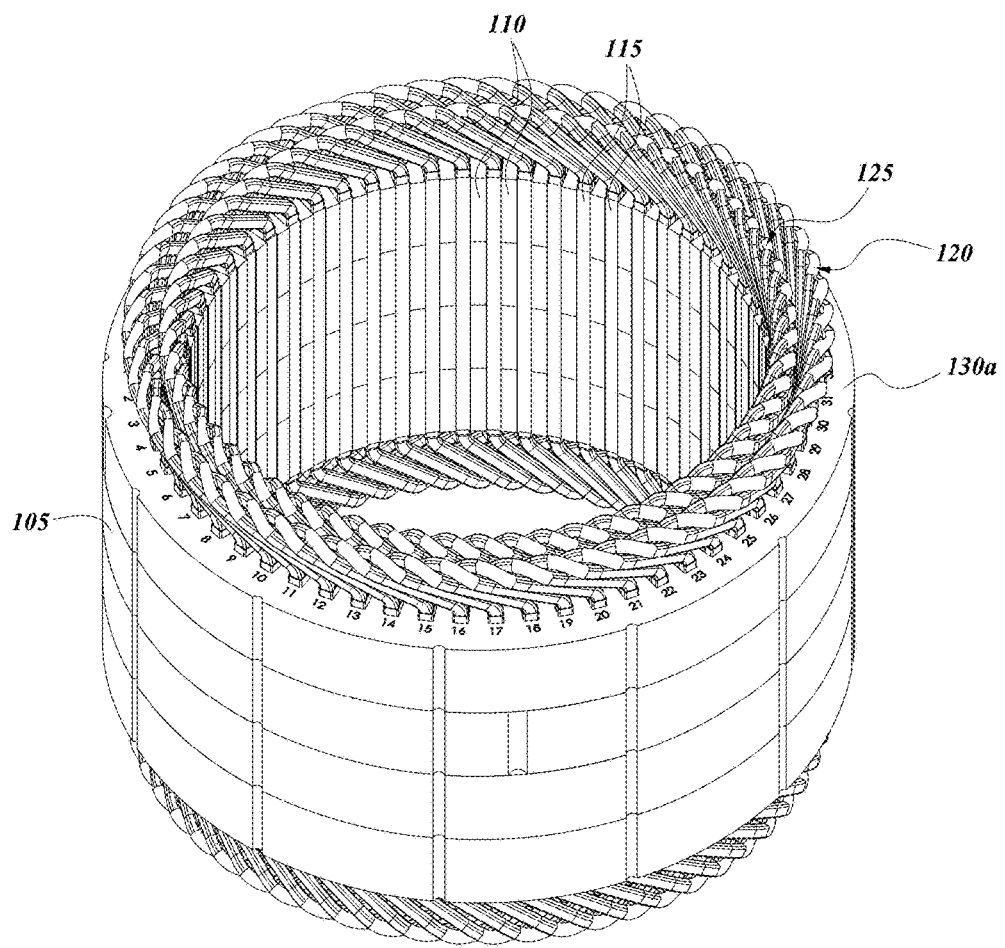
FIGS. 1A-1D illustrate various views of a stator having continuous, radially-inserted windings as described herein.

The disclosure is related to systems and methods for evaluating the electrically insulating coating of a formed wire or wires. In one non-limiting example of systems and methods described herein, an electrically conductive brush, such as a metal brush, passes over bends in stator wire to detect local areas of varnish insulation damage when contact occurs between the brush and exposed metal stator wire. The formed wire or wires can be continuous stator windings for electric machines. The formed wire or wires can include a conductor and an electrically insulating coating applied to the conductor. The electrically insulating coating can fail as a result of a defect in the coating. Failures and defects in the electrically insulating coating can include, but are not limited to, to a crack in the coating, defects in application of the coating, areas of thin coating, areas of thick coating, uneven coating, bubbles in the coating, and particulates in the coating. A portion of the conductor may be exposed through the electrically insulating coating where there is a defect in the electrically insulating coating.

The systems and methods described herein can detect these defects prior to insertion of the formed wire or wires into slots of a stator during assembly of the stator. The systems and methods are designed to evaluate the formed wire or wires to detect such defects in the electrically insulating coating prior to insertion of the formed wire or wires into the slots of the stator during a manufacturing process. The systems and methods described herein can produce substantial cost savings by detecting defects in formed wire or wires before insertion into a stator. Because defects in the electrically insulating coating can cause failure of the electric machine, the disclosed systems and methods can contribute to greater longevity of electric machines.

The stator can comprise a magnetically permeable material. Some embodiments of the stator can be made of a stack of multiple thin layers of electrical steel, for example punched to produce the desired cross-sectional topology, stacked, and laser welded together. In some embodiments, the stator layers can be steel laminate with insulation and/or adhesive provided on both faces.

The formed wire or wires can be formed from a conductor having a shaped cross-section and an external surface. In some embodiments, a cross section of the conductor has a polygonal shape such as but not limited to a triangular, rectangular, or square cross-sectional shape. In other embodiments, a cross section of the conductor has a rounded shape such as a circular, oval, or elliptical cross-sectional shape. Other cross-sectional shapes are contemplated. The conductor or portions thereof can comprise any suitable conductive material, which can be a metal such as aluminum, brass, copper, tin, or an alloy thereof. For example, the conductor can be made of a copper alloy. Alloys can be heat treated to produce a structurally robust conductive material having high yield strength.

The electrically insulating coating is configured to prevent conductor to conductor contact of adjacent stator windings. In some cases, the electrically insulating coating is configured to prevent conductor contact with any other conductive surface of the electric motor. For example, the electrically insulating coating can be configured to prevent conductor to stator contact. In some embodiments, the electrically insulating coating can comprise polyimides, PET, PEEK, or Kapton®. Kapton is a polyimide film with a chemical name of poly-oxydiphenylene-pyromellitimide. The electrically insulating coating can be applied in a liquid, gaseous, or solid state. The electrically insulating coating can be applied by spraying, dipping, wrapping, layering, co-extrusion, nesting, vapor deposit or other techniques known in the art. In some embodiments, the electrically insulating coating is a resin. Other insulated materials and techniques of application are contemplated.

The formed wire or wires can include a number of parallel or substantially parallel linear segments. The parallel or substantially parallel linear segments can be connected by crowns, where each crown includes a plurality of bends formed in the wire. During manufacturing of the formed wire or wires, it is desirable to achieve compression and elongation of the exterior surface of a bend in a way that does not stress electrically insulating coating that has been applied to the conductor. Thus, in optimal conditions, the method of bending the wire to form bends provides for a formed wire with no breaks or other defects in the electrically insulating coating.

The crowns can include a plurality of bends, such as a compound bend. A first bend of the compound bend is formed in a crown by shaping the formed wire into a v-shape. As used herein, a "v-shape" can refer to two straight segments joined by an angled or bent portion that can be either a sharp bend or a contoured bend. The straight segments can each have an additional angle formed between the straight segment and a linear segment of the conductor that can be positioned in a stator slot.

A second bend of the compound bend is formed in the crown after formation of the first bend by shaping the conductor into an s-shape, asymmetrical v-shape, or second v-shape. As used herein, an "s-shape" can refer to three straight or curved segments joined by two angled or bent portions that can be either sharp or contoured bends. As used herein, an "asymmetrical v-shape" can refer to two straight segments of uneven lengths joined by an angled or bent portion that can be either a sharp or contoured bend. In some embodiments, the second bend of the compound bend provides a compact nesting configuration between adjacent crowns when the formed wires are positioned in the stator.

In some cases, the electrically insulating coating is applied to the conductor prior to bending the wire to form the crowns. In other cases, the electrically insulating coating is applied to the conductor after bending of the wire to form the crowns. In either case, the electrically insulating coating on a formed wire can fail for a variety of reasons, causing exposure of the conductor in the area where failure occurs.

In some cases, the process of bending the formed wire can cause failure of the electrically insulating coating. In one non-limiting example of such a failure, the electrically insulating coating cracks in the area of a bend when the wire is shaped to form a crown, exposing a portion of the conductor in the area of the crack. Other defects can cause a portion of the conductor to be exposed through the electrically insulating coating. Typically, the electrically insulating coating will fail at a location of a bend rather than the straight or substantially straight segment. In some embodiments, the systems and methods are configured to test the formed wire or wires at the locations most likely to fail. In other embodiments, the entire length of the formed wire is tested or a substantial portion thereof.

After formation of the bends in the plurality of crowns, the formed wire is arranged on a system for testing in order to detect defects in the electrically insulating coating. The system can include a surface designed to support all or a portion of the formed wire or wires during testing. The surface can support the parallel or substantially parallel linear segments of the formed wire or wires. For example, when viewed from a perspective orthogonal to the surface, the parallel or substantially parallel linear segments of the formed wire or wires can lie directly over the surface. When viewed from a perspective orthogonal to the surface, the crowns connecting the parallel or substantially parallel linear segments can extend beyond edges of the surface such that the crowns do not lie directly over the surface. In some cases, the crowns are not supported by the surface. In one example, when positioned over the surface of the test system, the wire has a length dimension extending along a longitudinal or x-axis direction of the test system and a width dimension extending along a lateral or y-axis direction of the test system. The surface of the platform can have a length dimension extending along the x-axis of the test system and a width dimension extending along the y-axis. The width of the wire can be greater than the width of the surface such that crowns in the wire extend beyond the edges of the surface in the y-direction. In some cases, bends connecting the crown and a linear segment of the wire also extend beyond the edges of the surface in the y-direction.

The system can include a high potential ("hipot") tester. The first end of each formed wire can be grounded, such as by electrical connection to a floating ground terminal of the hipot tester. The system can include one or more electrically conductive brushes to which a voltage is applied via the hipot tester, such as by electrical connection to a voltage terminal of the hipot tester. The electrically conductive brushes can be metal brushes, for example. In the illustrated embodiment, the system includes three brushes but other embodiments have a different number of brushes (e.g., one, two, three, four, five, six, seven, eight, nine, ten, etc.). The brush is configured to sweep across the crowns of the formed wire or wires. As the brush sweeps, the electrically conductive bristles of the brush contacts the crowns. As the brush sweeps, the electrically conductive bristles of the brush contacts at least the bends associated with the crown, and may contact additional bends adjacent to the crowns such as the bends between the parallel or substantially parallel linear segment and the crown. In some embodiments, the brush includes two opposing non-contacting bristle portions.

In an optimal situation where there are no defects in the electrically insulating coating, the conductive bristles of the brush contact only the electrically insulating coating of the formed wire or wires. In an optimal situation where there are no defects in the electrically insulating coating, the conductive bristles of the brush do not contact the conductor of the formed wire or wires. In the case of failure or the presence of a defect in the electrically insulating coating, the conductive bristles of the brush contact the conductor of the formed wire or wires.

In some embodiments, the hipot tester is configured to detect a change in current when the conductive bristles of the brush pass over a defect in the electrically insulating coating and contact exposed conductor. In some embodiments, the current is electrical leakage current. In other embodiments, the hipot tester sends a signal to another device, such as a computer, that is configured to detect a change in leakage current when the conductive bristles pass over a defect in the electrically insulating coating and contact exposed conductor. In some embodiments, the hipot tester, the computer, or another component of the system includes a processor configured to perform one or more functions described herein. The processor can determine that the formed wire or wires includes a defect. The processor can determine the location of the defect. The processor can aggregate data from obtained during testing of many wires that have been determined to include a defect. For instance, the processor can determine a pattern of failure in a recurring location, such as a particular bend or a particular crown, in a series of tested wires.

It is generally desirable to detect defects in the electrically insulating coating prior to insertion of the formed wire or wires in the stator. Detecting defects during manufacturing reduces the likelihood of failure during operation. For example, a defect in the formed wire or wires during manufacturing can prevent or reduce short circuiting of adjacent windings in the stator. The defect in the electrically insulating coating causes the conductor of the formed wire to be exposed. During use, the conductor can dissipate energy at the site of the failure. During use, the conductor can cause a short circuit at the site of failure. During use, the conductor can deliver energy to another winding at the site of failure. During use, the conductor can delivery energy to the stator at the site of failure. The formed wire or wires are typically low-cost components on the larger engine systems. The disclosed systems and methods can detect failure in these low-cost components before the defective formed wire or wires are incorporated into larger and more expensive systems. In some methods of use, the user discards a formed wire or wires, if a defect is detected, prior to installing the formed wire or wires into a stator.

After testing of the formed wire or wires, the formed wire or wires can be wrapped into a circular configuration. In the circular configuration the linear segments of the formed wire or wires are inserted radially into a stator, where successive linear segments of the conductor in the circular configuration alternate between two layers, such that a single circular configuration provides two conductors per slot. Successive linear segments of the formed wire or wires can be positioned in stator slots that are spaced apart by a predetermined amount based on the winding configuration. Once the formed wire or wires has been wrapped into the circular configuration and inserted into the stator, adjacent crowns in a circular row of the formed wire or wires can nest with one another via the second bend of the compound bend. As used herein with respect to formed wire or wires, "successive" refers to two components that are formed from proximate portions of the conductor while "adjacent" refers to conductor portions that are proximate to one another after insertion into the stator.

One example of an electric motor includes a stator having a number of conductive windings wound through the stator to produce a rotating magnetic field in the frame of reference of the stator, a rotor rotatable within the stator, and an enclosure containing the windings, stator, and rotor. The formed wire or wires described herein can be used as conductive windings in electric motors. The formed wire or wires can be continuous windings, for instance, a single wire wound into a wave pattern and then radially inserted into a stator. The continuous windings can be radial or flat. In some embodiments, the continuous windings can have a round cross-sectional shape, and in other embodiments, the continuous windings can have a non-round cross-sectional shape. The continuous windings are in contrast to hairpin conductors which require welding to adjacent hairpin conductors according to the connection requirements of the windings. In some embodiments, the stator can have 90 partially-closed slots. In some embodiments, 18 continuous windings can be wound through the slots of the stator in a winding pattern with eight layers of winding conductors per slot. When all conductors are wound through the stator, they can nest with adjacent conductors at the end turn of the crown portions to form a compact arrangement. The continuous windings can be radially inserted into the stator slots. Radial insertion of the winding affords a more compacted conductor configuration within each slot, thereby increasing the slot fill factor.

One described implementation of the formed wire or wires is use in an electric vehicle motor. The formed wire or wires can be used in electric motors for other applications as well. The formed wire or wires can also be advantageous for use in other types of electric machines, for example in generators, such as generators for use in wind or water turbines. Various embodiments will be described below in conjunction with the drawings for purposes of illustration. It should be appreciated that many other implementations of the disclosed concepts are possible, and various advantages can be achieved with the disclosed implementations. Headings are included herein for reference and to aid in locating various sections. These headings are not intended to limit the scope of the concepts described with respect thereto. Such concepts may have applicability throughout the entire specification.

Overview of Example Continuously Wound, Radially-Inserted Conductors

Figure 1B:
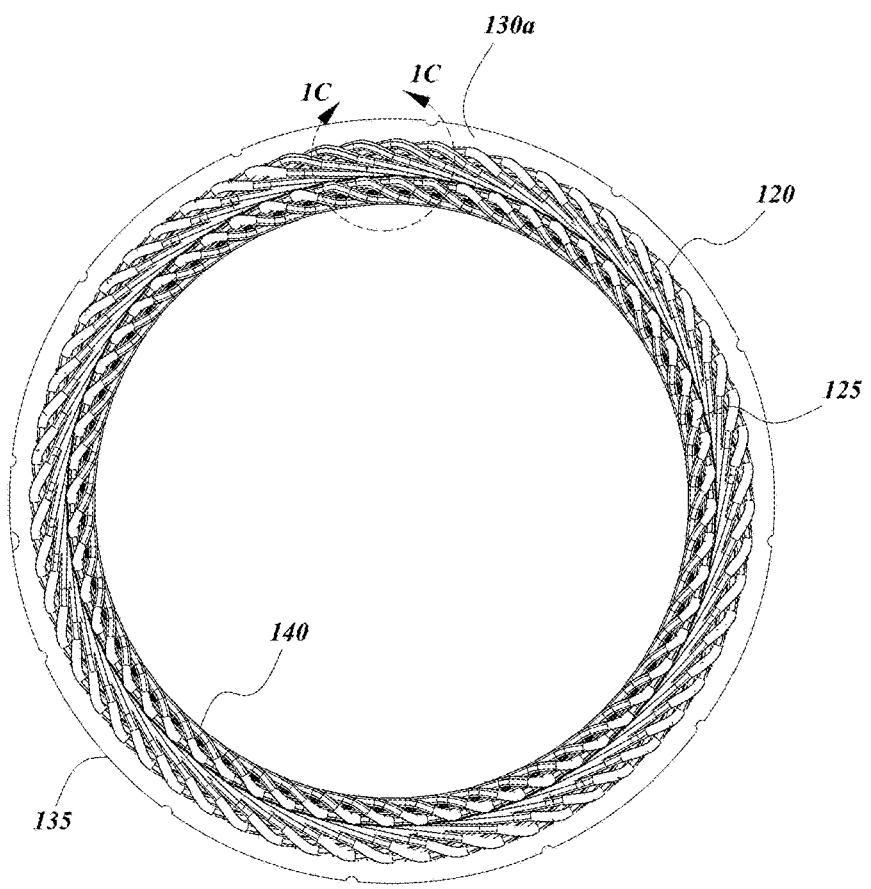
Figure 1C:
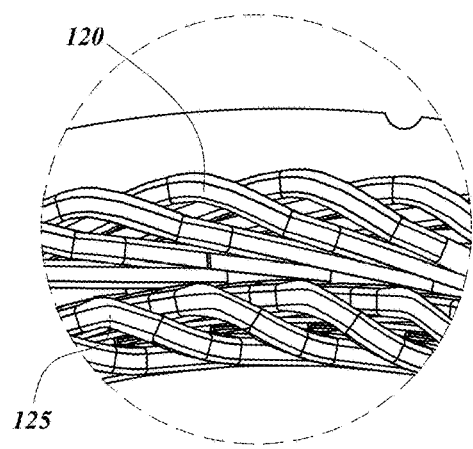
Figure 1D:
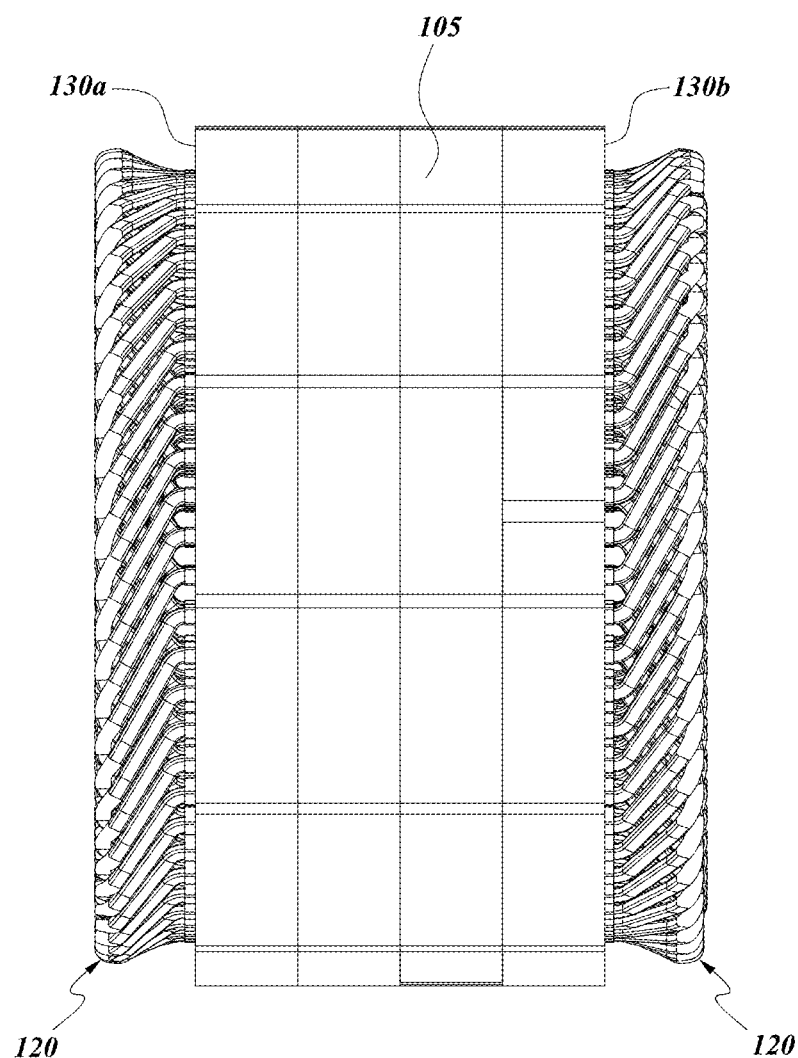

FIG. 1A illustrates a front, top perspective view of a stator 105 for an electric machine, the stator 105 having continuous, radially-inserted windings 125, 120 formed with insulation-covered crowns as described herein. FIG. 1B illustrates a top view of the stator 105 and windings 125, 120. FIG. 1C illustrates a zoomed-in view of a portion of the windings 125, 120 to illustrate the nesting configuration of adjacent winding crowns. FIG. 1D illustrates a front view of the stator 105 and windings 125, 120.

The stator 105 is formed as a magnetically permeable cylindrical stack having a stator backiron along the outer diameter 135 (visible at end face 130*a* in FIG. 1A) and slots 115 formed between stator teeth 110 along the inner diameter 140. In some embodiments, as illustrated, the slots 115 can be partially closed, as the stator teeth 110 can contain tooth-tips along the inner diameter of stator 105. Other embodiments may have fully open slots in the stator 105 where the stator teeth are shaped so that the opening of the stator slot is the same width as the inner width of the slot.

The backiron and teeth 110 of the stator 105 can be made of a stack of multiple thin layers of electrical steel, the stack having first and second end faces 130*a*, 130*b*. In some examples, the layers of electrical steel can be punched to produce the desired cross-sectional topology, stacked, and laser welded together. In one embodiment, the stator layers can be steel laminate with insulation and/or adhesive provided on both faces. Generally, the stator 105 is made of any magnetically permeable material suitable for conducting magnetic flux.

Linear segments of the windings 125, 120 can be positioned in the stator slots 115 with crowns of the windings 125, 120 crossing over the first and second end faces 130a, 130b. As shown in FIG. 1B, multiple layers of circular windings can be positioned in stator 105, with an inner layer 125 and an outer layer 120 illustrated. Other embodiments can have three, four, or more layers of circular windings depending on the desired number of conductors per stator slot 115. The exposed crowns of at least the inner winding 125 can be angled away from the inner diameter 140 of the stator 105 to allow for insertion of a rotor into the stator 105, such that an inner diameter of the nested portion of the inner winding 125 is equal to or greater than the inner diameter 140 of the stator 105. FIG. 1C illustrates a close up view of the nested windings as depicted in FIG. 1B. As illustrated, adjacent conductors nest with one another in the region of the compound bend in the crown, and a conductor transitions between first and second stator slot layers at the compound bend. At the successive crown (not illustrated, positioned over the opposing end face 130b of the stator) the conductor transitions back from the second stator slot layer to the first stator slot layer. Thus, the double-layer circular configuration fills four stator slot layers. As shown in FIG. 1D, the windings can form nested configurations outside of both of the first and second end faces 130a, 130b of the stator 105.

Each conductor can have a cross-section, such as a rectangular cross-section. Each conductor can be composed of a single, solid conductor or of a number of thin wires or strands. Each conductor can include an electrically insulating coating around its exterior faces. Though referred to as separate windings 120, 125, these winding layers can be formed as a single winding from a single, continuous conductor in some embodiments, where a first portion of the conductor is shaped to form the crowns of the inner layer 125 and a second portion of the conductor can be shaped to form the crowns of the outer layer 120. Greater or fewer layers can be used. Further, in some examples of three-phase electric machines each layer of the winding can include three conductors. For example, three windings formed with crowns as described herein can be wound such that the axes of the three windings are displaced by 120°. When the three windings are excited with sinusoidal currents, a rotating magnetic field is produced. Other three-phase winding implementations can achieve a similar effect by using a single distributed winding.

The stator 105 can be used in an electric machine, for example an interior permanent magnet electric machine. A rotor assembly (not illustrated) is placed concentrically within the stator assembly such that an air gap exists between the outer diameter of the rotor and the tips of the stator teeth 110 that form the inner diameter 140 of the stator 105. The magnetically permeable rotor iron is used to conduct magnetic flux, and some implementations of the rotor can include one or more permanent magnets. The electric machine also includes an electrical connection (not illustrated) coupled to each stator winding 120, 125.

Figure 2A:
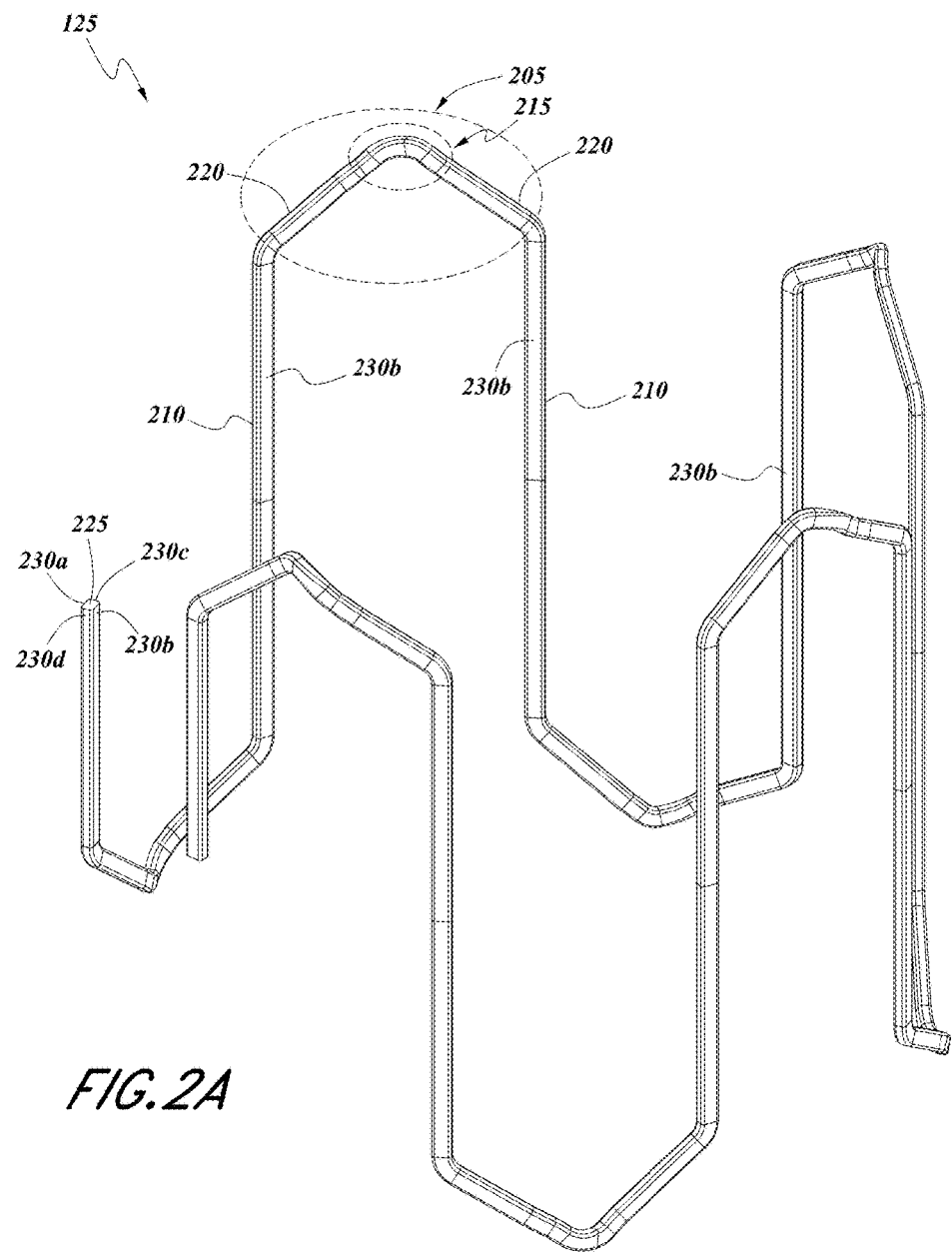
FIG. 2A illustrates a portion of the inner portion of a continuous winding of FIGS. 1A-1D.

FIG. 2A illustrates a portion of the inner portion 125 of the continuous winding of FIGS. 1A-1D. The winding includes a number of linear segments 210 positioned parallel to one another, with successive linear segments connected by crowns 205. The linear segments 210 can be radially inserted into the slots of a stator according to a determined winding pattern. The crown 205 includes two substantially straight segments 220 and a compound bend 215 at a peak of the crown between the straight segments 220. Optimally, formation of the compound bend 215 does not stress the electrically insulating coating of the conductor in order to minimize failure of the electrically insulating coating. As described above, however, failures caused by defects can exist at any location in the electrically insulating coating, and in particular at the compound bend 215 during bending of the continuous winding to form the compound bend 215.

The conductor of the winding has a rectangular cross-section 225. The conductor can be composed of a single, solid conductor or of a number of thin rectangular wires or strands. The edges of the cross-section 225 define first 230b, second 230a, third 230c, and fourth 230d exterior faces of the conductor. Though discussed and illustrated primarily in terms of a conductor having rectangular cross-section where two sides of the cross-section are longer than the two other sides, it will be appreciated that the disclosed techniques can also be applied to conductors having a square cross-section.

The conductor can include an electrically insulating coating around its exterior faces 230a-230d. The electrically insulating coating can be applied to the first exterior face 230b, second exterior face 230a, third exterior face 230c, and fourth exterior face 230d of the conductor. The electrically insulating coating can be applied along at least a portion of the length of the winding. The electrically insulating coating can be applied along the entire length of the winding.

The electrically insulating coating can be applied to the winding prior to bending the winding. The electrically insulating coating can be applied when the winding is substantially straight. During bending, the winding can be compressed as described below to form one or more bends which give the winding its final shape. The windings described herein can include a number of linear segments or substantially linear segments positioned parallel to one another (for example, linear segments 210 illustrated in FIG. 2A). The linear or substantially linear segments can be radially inserted into the slots of a stator according to a determined winding pattern. The successive linear or substantially linear segments are connected by crowns formed by compound bends (for example, compound bend 215 illustrated in FIG. 2A). The crown can include one or more straight or substantially straight segments (such as segments 220 illustrated in FIG. 2A) and one or more bends (described below with reference to FIGS. 2B and 2C). The bends of the crown can form a peak between the successive linear or substantially linear segments.

Figure 2B:
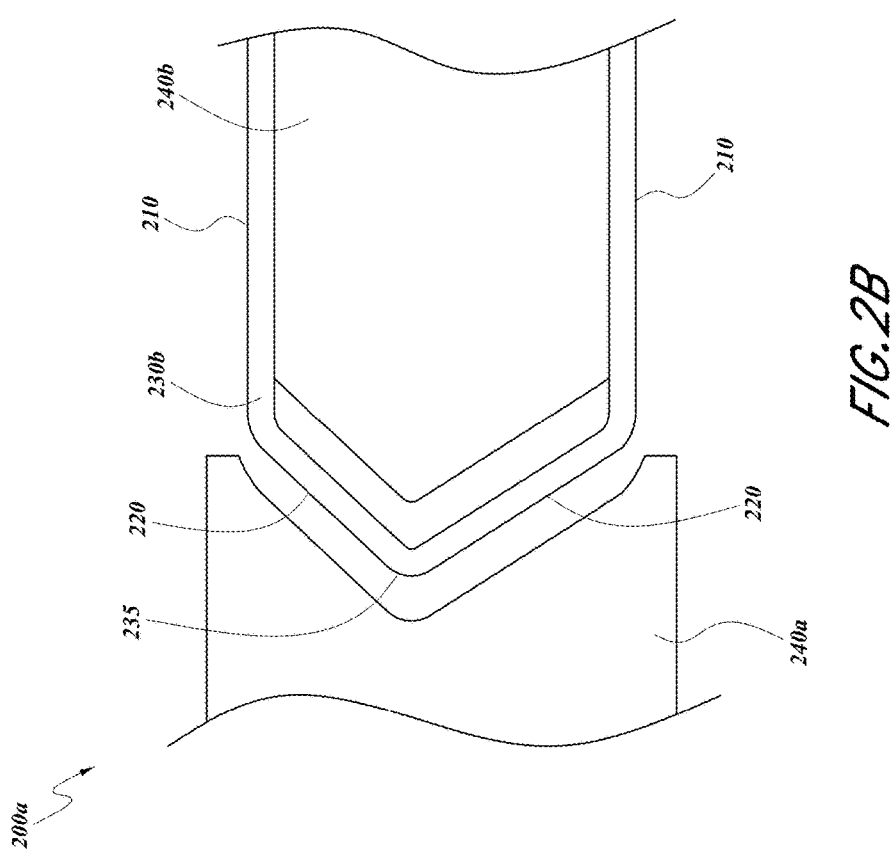
FIG. 2B illustrates a side view of a crown of the continuous winding of FIG. 2A and example molds for forming a first bend of the crown.

FIG. 2B illustrates a side view 200a from a perspective orthogonal to the first exterior face 230b of the crown 205 of FIG. 2A as well as a portion of two successive linear segments 210 of the continuous winding. FIG. 2B also illustrates example corresponding mold portions 240a, 240b for forming a first bend 235 of the crown 205. The first bend 235 of the compound bend can be formed by shaping the conductor into a v-shape. In the specific configuration of the conductor in the illustrated crown, mold portions 240a, 240b create a v-shaped bend that compresses a portion of the fourth exterior face 230d and elongates a portion of the third exterior face 230c. As illustrated, this shaping can be accomplished by applying force to the conductor along a first direction between corresponding female 240a and male 240b portions of a mold. In other examples, the first bend 235 can be formed by wrapping the conductor around a single mold with sufficient force. Along with formation of the first bend 235, the straight segments 220 can each have an additional bend formed between the straight segment 220 and the connected linear segment 210.

FIG. 2C illustrates a top view 200b from a perspective orthogonal to the third exterior face 230c of the crown 205 of FIG. 2A. FIG. 2C also illustrates example mold portions 250a, 250b for forming a second bend 245, 255 of the crown.

The second bend 245, 255 of the compound bend 215 can be formed in the crown 205 after formation of the first bend 235. In the example of FIG. 2C, the second bend is formed by shaping the conductor into an s-shape with two radiused bends 245, 255. The s-shape is formed by compressing and elongating portions of the first and second exterior faces 230a, 230b. As illustrated, this shaping can be accomplished by applying force to the conductor along a second direction by pressing the conductor between two portions 250a, 250b of a mold. The second direction is perpendicular to the first direction. The second bend 245, 255 can provide for a compact nesting configuration between adjacent crowns in a circular row of the winding when positioned in the stator.

Figure 2D:
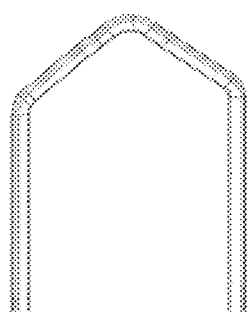
FIG. 2D illustrates a view of one example bend of a stator winding that can be evaluated using systems and methods described herein.
Figure 2E:
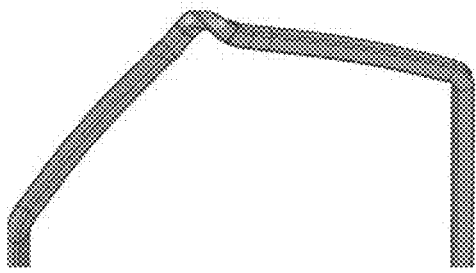
FIG. 2E illustrates a view of another example bend of a stator winding that can be evaluated using systems and methods described herein.

Systems and methods for evaluating electrically insulating coating of a formed wire or wires are not limited to the wires illustrated in FIGS. 2A-2C. FIG. 2D illustrates a view of one example bend of a stator winding that can be evaluated using systems and methods described herein. The example bend illustrated in FIG. 2D can be similar to a first bend described above with reference to FIGS. 2A and 2B. FIG. 2E illustrates a view of another example bend of a stator winding that can be evaluated using systems and methods described herein. As illustrated in FIGS. 2D and 2E, the wires can be formed in either a flat or radial configuration, and can have different folding characteristics.

In an optimal situation, compression and elongation of the various exterior faces during formation of the compound bend 215 do not stress the electrically insulating coating of the conductor to failure. Thus, in optimal conditions the compound bend 215 can provide for a continuous winding with no breaks or other defects in the insulation at the crowns 205. In some situations, however, the electrically insulating coating of the conductor does fail, such as but not limited to formation of a crack or other defect in the coating during bending.

The specific shaping of the first and second bends is provided for purposes of example and is not intended to limit the scope of possible compound bends in an insulation-covered successive winding according to the present disclosure. The specific shaping of crown 205 can be adjusted based on a number of factors including (1) the winding pattern, for example a number of slots that will be between successive linear segments 210, (2) stator dimensions including slot size and slot spacing, (3) a diameter of the winding as it is wound through the stator slots. In some examples successive crowns or groups of crowns may be shaped differently from one another as needed to achieve the desired winding pattern. In some embodiments, the first and second bend are bent in two different directions. In some embodiments, formation of a first bend in a conductor applies a force to the conductor in a first direction orthogonal to the direction of force used to form a second bend. The spirit of the disclosure encompasses any continuous winding having a plurality of bent segments, such as but not limited to a plurality of crowns including one or more bends.

Figure 3A:
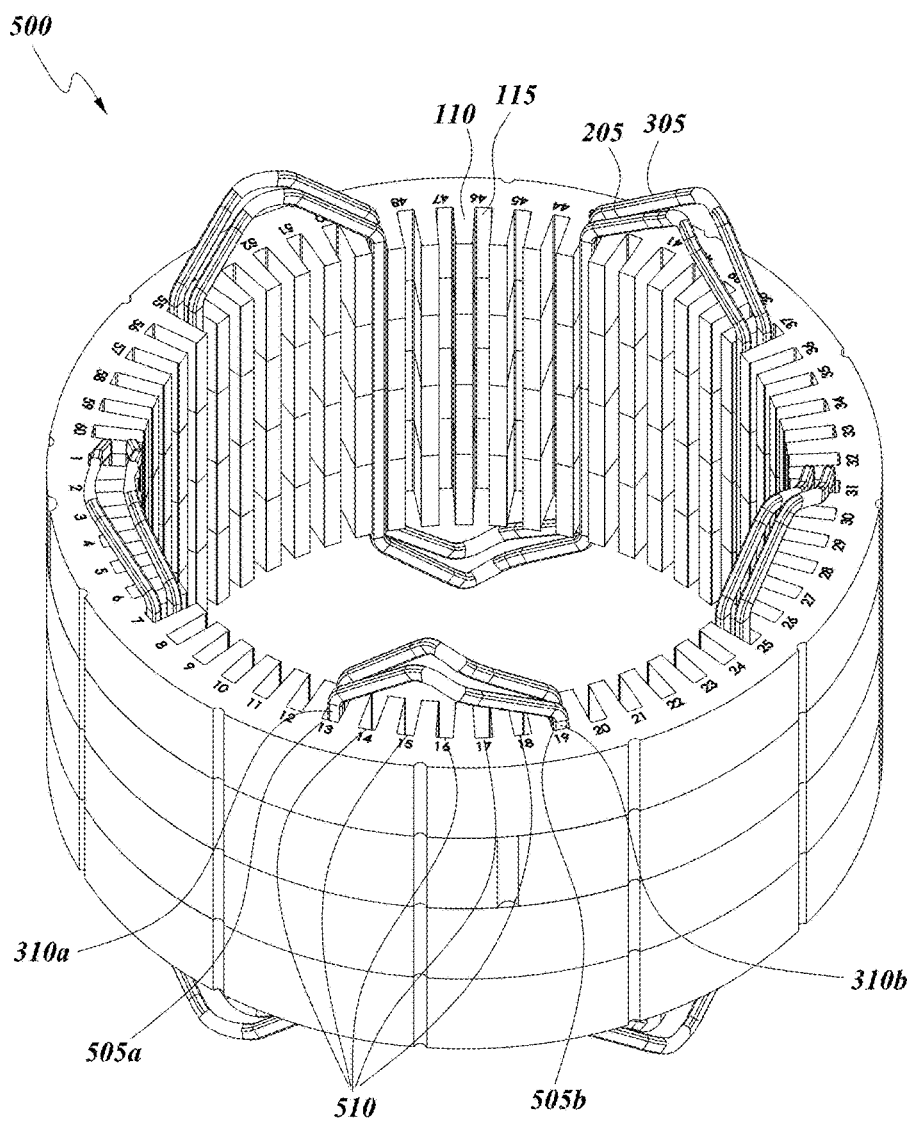
FIG. 3A illustrates a portion of a double-layer winding inserted into a stator.

FIG. 3A illustrates a stator winding 500 having a portion of the double-layer winding inserted into the stator. FIG. 3A illustrates how crowns 205, 305 of the winding cross over the end face of the stator. FIG. 3A further illustrates how a first linear segment 310a of the winding is positioned in a first slot 505a and a successive linear segment 310b is positioned in a second slot 505b with a number of intervening slots 510 separating the first slot 505a from the second slot 505b. In the depicted example the number of intervening slots is five, however this can be altered according to the specifications of a given winding design.

Figure 3B:
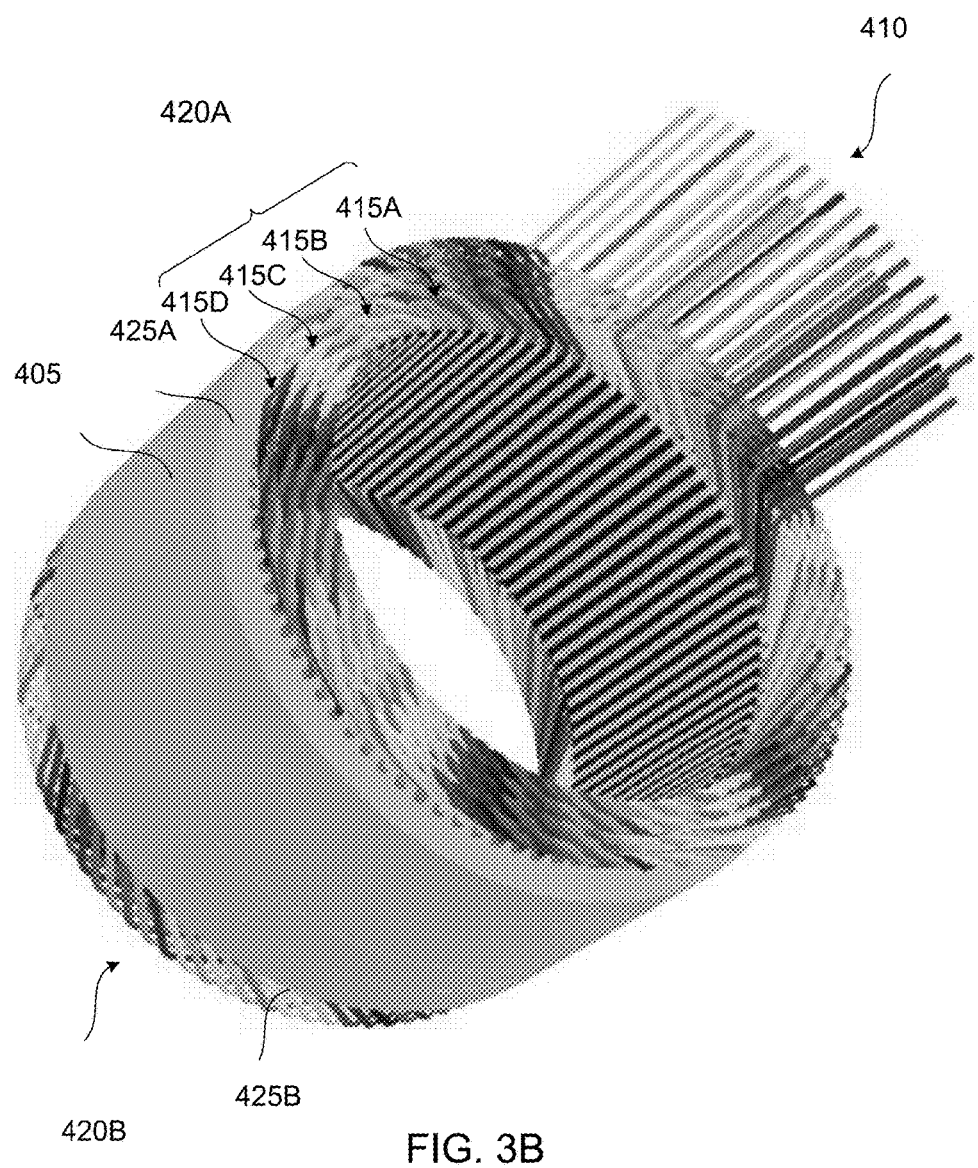
FIG. 3B illustrates a perspective view of an example stator and continuous windings according to another design.

FIG. 3B illustrates a perspective view of an example stator 405 and windings 410. The stator 405 can be of generally cylindrical form having a first end face 425A and a second end face 425B, an inner diameter and an outer diameter, a backiron extending from the outer diameter to the base of a number of teeth, and teeth extending from the backiron to the inner diameter. The teeth can be separated by a number of slots and the conductive windings 410 can be positioned within the slots. In some embodiments of the electric motor, the windings 410 can be continuous windings inserted into the stator slots in a predetermined winding configuration such that each winding has a phase lead (input) end and a neutral (output) end extending above one of the end faces 425A of the stator. The illustrated winding includes eight layers and four circular rows of crowns, where the adjacent winding crowns nest with one another to form a compact winding arrangement of two sets of nested crowns 420A, 420B above the first and second end faces 425A, 425B of the stator.

A continuous winding can include a number of generally straight leg portions for positioning within the stator slots and a number of crowns 415A-415D formed in the winding connecting successive leg portions. The crowns 415A-415D can include a bend or a compound bend at an apex of the crown, referred to herein as an "end turn," and successive crowns in a winding can extend alternately above the first and second end faces of the stator. The shape of the bend can provide an amount of displacement between successive leg portions equal to a thickness of the conductor, that is, equal to the span of one slot layer, in order to provide the layer alternation described herein. The illustrated winding includes eight layers and four circular rows of crowns, where the adjacent winding crowns nest with one another to form a compact winding arrangement of two sets of nested crowns 420A, 420B above the first and second end faces 425A, 425B of the stator. In the illustrated example, the winding pattern includes 18 conductors fed in parallel with six conductors per each of the three phases. In other embodiments the stator design or winding pattern can have different numbers of circular rows and a corresponding double number of conductors in each stator slot, and can have a different pattern of phase positioning around the stator circumference.

Methods and Systems for Evaluating Insulation of Formed Wire

Figure 4A:
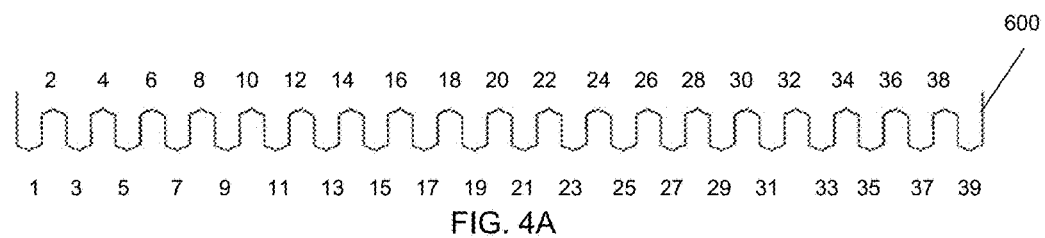
FIG. 4A illustrates an example of a formed wire and FIG. 4B illustrates an example of formed wires.
Figure 4B:
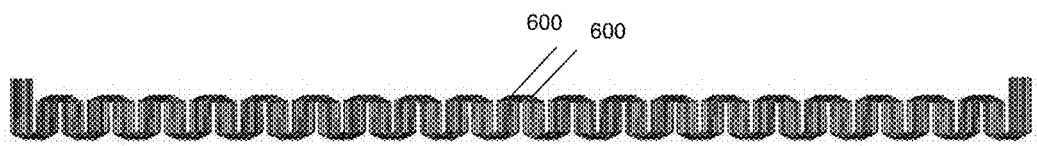

FIG. 4A illustrates an example of a formed wire 600. FIG. 4B illustrates an example of a plurality of formed wires 600. FIG. 4B shows nine formed wires stacked over one another in a z-direction (extending out of the page), with each wire shifted to right in the x-direction relative to the underlying wire. Each formed wire can have the same shape. Each formed wire can be identical. In some embodiments, two or more formed wires have a different shape. In the illustrated embodiment each formed wire has thirty-nine crowns, labeled 1-39 in FIG. 4A. Each crown can have the same shape. Each crown can be identical. In some embodiments, two or more crowns have a different shape. Other configurations are contemplated based on the number of slots in the corresponding stator and the design of the electric motor. Each of the formed wires 600 and the plurality of formed wires 600 include a conductor and electrically insulating coating.

In FIG. 4B, each of the nine formed wires is adjacent to another wire in the z-direction to another formed wire. Each of the nine formed wires is longitudinally offset in the x-direction from another of the formed wires. In this example, the formed wires are offset such that the overlap in the z-direction between adjacent formed wires is minimized. In the illustrated embodiment, adjacent formed wires overlap at a rectangular-shaped segment spaced from the peak (see, as one example, segment 694 illustrated in FIG. 9; the wires will overlap under the segment 694). The rectangular segment can be located on a substantially straight segment of the crown or on a portion of the crown that does not include a bend, where the likelihood of failure of the electrically insulating coating is decreased. In other embodiments, not shown, the system includes eighteen formed wires. The system can includes any number of formed wires (e.g., one, two, three, four, five, six, seven, eight, nine, ten, eleven, twelve, thirteen, fourteen, fifteen, sixteen, seventeen, eighteen, nineteen, twenty, more than five, more than ten, more than fifteen, more than twenty, more than twenty-five, more than thirty, etc.). The number of formed wires of the system can depend on the design of the associated stator in which the formed wires will eventually be installed. The number of formed wires in the system can depend on the winding pattern of the stator. In some cases, the number of wired positioned in the system for testing is limited to minimize overlap between adjacent wires in the z-direction. For example, in the illustrated embodiment that includes nine formed wires positioned in the system for testing, addition of a tenth formed wire for testing may undesirably increase the total surface area of wires that overlap in the z-direction and are therefore not exposed for testing.

FIG. 5A illustrates an example of a system for testing electrically insulating coating of the formed wire of FIG. 4A. FIG. 5B illustrates an example of a system for testing electrically insulating coating of the plurality of formed wires of FIG. 4B. Although embodiments of systems and methods for testing formed stator wires will be described with reference to FIG. 5A (illustrating one formed stator wire) and FIG. 5B (illustrating nine formed stator wires), the systems and methods can be advantageously applied to test insulation properties of, and detect insulation defects in, other types of wires and other numbers of wires. In some embodiments, the system for testing the formed wire and the system for testing the plurality of formed wires are similar or identical. In other embodiments, the system can be specially designed for the number of formed wires. As one example, the system for testing the plurality of formed wires can include a different power generator. As another example, the system for testing the plurality of formed wires can include a plurality of wire clamps to maintain the plurality of formed wires in a stationary position. As another example, the system for testing the plurality of formed wires can be optimized to vary certain parameters such as the speed of a motor that controls movement of components in the system.

As shown in FIGS. 5A and 5B, the system can include a test platform 601 which can include a first surface 602. The first surface 602 can be generally rectangular as shown. The first surface 602 can have a length dimension extending along the x-axis of the test system and a width dimension extending along the y-axis. The first surface 602 can be planar or substantially planar. The first surface 602 can be disposed directly under the parallel or substantially parallel segments of the formed wire or wires in the z-direction (extending out of the page). In other words, the first surface 602 can be disposed under the straight or substantially straight segments of the formed wire or wires. The formed wires have a length dimension extending along an x-axis direction of the test system and a width dimension extending along a y-axis direction of the test system. The width of the wires can be greater than the width of the first surface 602 such that crowns in the wires extend beyond the edges of the first surface 602 in the y-direction. In some cases, the width of the wires can be greater than the width of the first surface 602 such that bends in the wire connecting the crowns and straight or substantially straight segments (see, for example, the bend connecting straight segment 220 of crown 205 and linear segment 210 in FIG. 2A) and the crowns both extend beyond the edges of the first surface 602 in the y-direction.

As described herein, the straight or substantially straight segments are unlikely or less likely to include defects in the electrically insulating coating. In the illustrated embodiment, the system is configured to evaluate the crowns of the formed wires to detect defects in the electrically insulating coating in the crowns. In some embodiments, the system is configured to evaluate bends between the crown and the straight or substantially straight segments to detect defects in the electrically insulating coating in the bends. In some embodiments, the system is configured to evaluate all bends in the formed wire or wires.

Figure 6A:
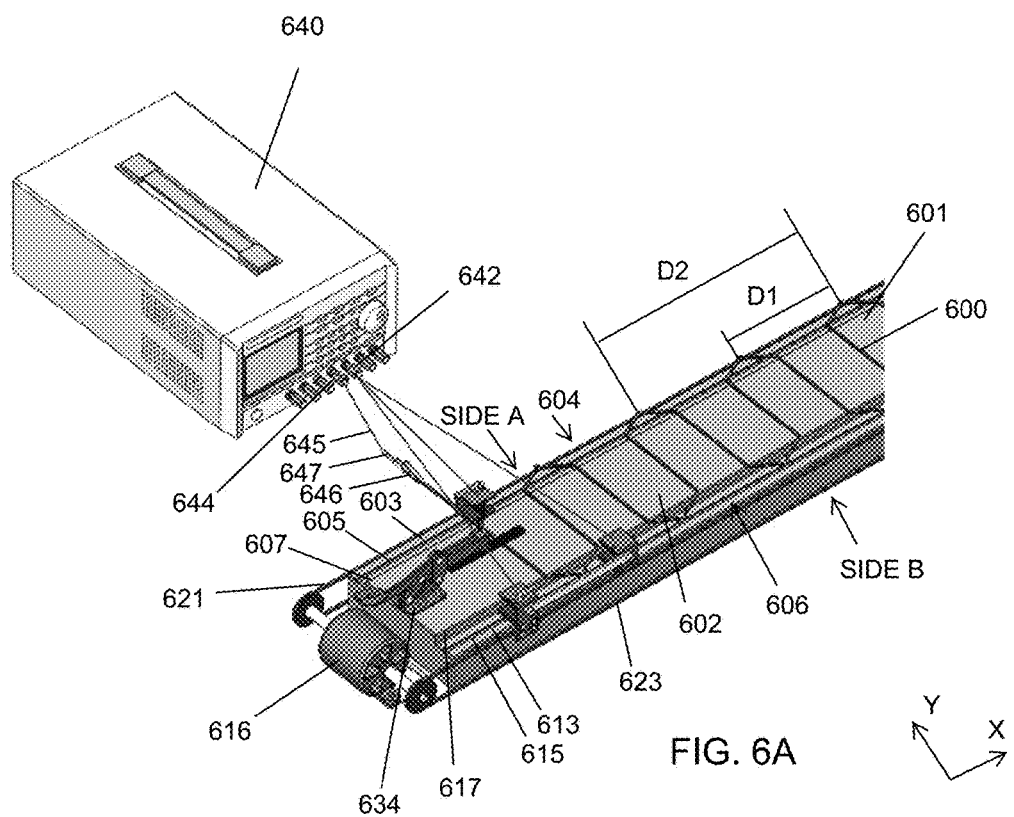

Referring to FIGS. 6A and 6B, the test platform 601 has the first surface 602, a second surface 603, and a third surface 613. The test platform 601 can include a longitudinal axis extending in an x-axis direction, where the second surface 603 is located on a first side (Side A) of the longitudinal axis and the third surface 613 is located on a second, opposing side (Side B) of the longitudinal axis. A groove 605 extending in the x-axis direction is formed in the second surface 603. A groove 615 extending in the x-axis direction is formed in the third surface 613. The grooves 605, 615 can be parallel.

The first surface 602 can include edges 607, 617 which extend in the x-axis direction. The system can include one or more undercuts 604, 606. The undercut 604 can be located on Side A and the undercut 606 can be located on Side B. The undercut 604 is formed as a result of the first surface 602 and the second surface 603 being at different heights in the z-direction. The undercut 606 is formed as a result of the first surface 602 and the third surface 613 being at different heights in the z-direction. As shown in FIG. 6A, there can be a vertical side in the z-direction connecting the first surface 602 and the third surface 613 to form undercut 606. The undercut 604 can be formed in a similar manner.

The undercuts 604, 606 can be on opposite sides of the longitudinal axis of the first surface 602. The undercut 604 allows a portion of the formed wire or wires to extend past an edge 607 of the first surface 602 in the y-direction. The undercut 606 allows another portion of the formed wire or wires to extend past an edge 617 of the first surface 602 in the y-direction, on the opposite side. The undercuts 604, 606 allow one or more bends of the formed wires 600 to extend past the first surface 602. In the illustrated embodiment, the crowns of each of the formed wires 600 extend past an edge of the first surface 602 in the y-direction. In some embodiments, all of the bends that interface between the crown and the straight or substantially straight segments of a wire extend past the edges 607, 617. In other embodiments, a portion of a plurality of bends of the formed wire or wires extends past the edges 607, 617.

Figure 8A:
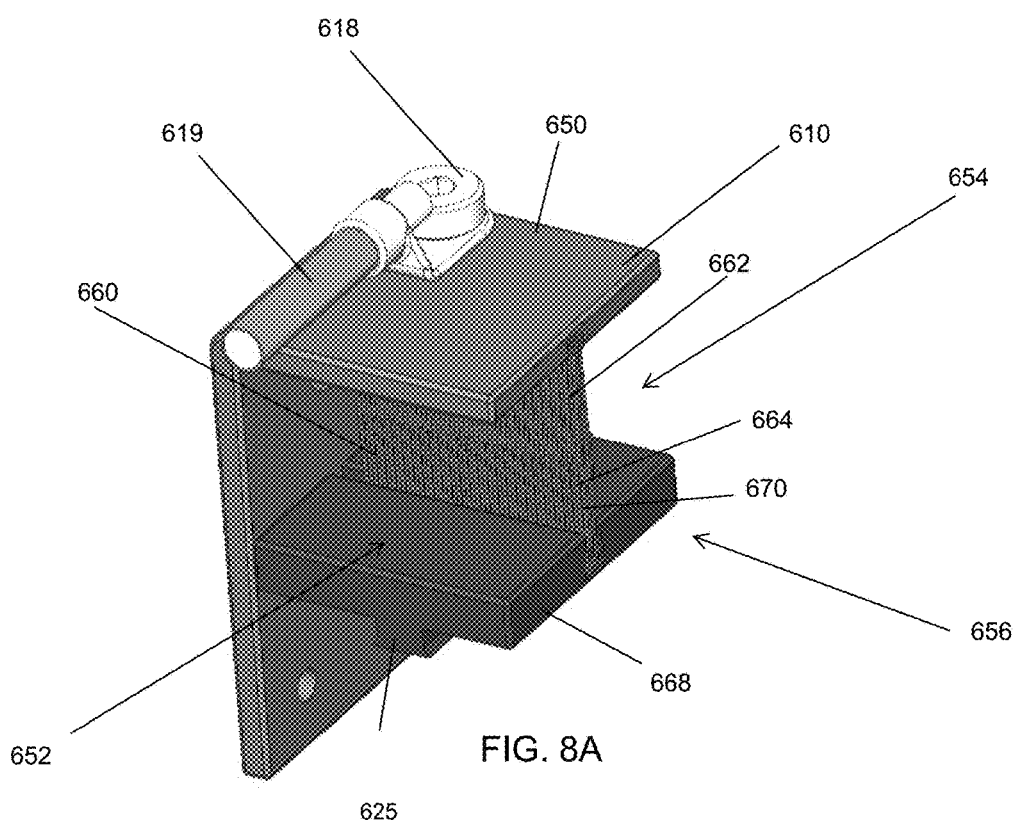
FIG. 8A illustrates the first carriage of the system.

The undercuts 604, 606 can allow a carriage to move along the first surface 602 of the test platform 601 and to interact with the plurality of crowns of the formed wires 600. In the illustrated embodiment, the system includes a first carriage 610, a second carriage 612, and a third carriage 614. The first carriage 610 can be on an opposite side of the first surface 602 as the second carriage 612 and the third carriage 614 in the y-direction. The first carriage 610 can be coupled to the groove 605 to move in the x-direction along the second surface 603. The first carriage 610 can be designed to move in the x-direction next to the edge 607 of the first surface 602. The second carriage 612 and the third carriage 614 can be coupled to the groove 615 to move in the x-direction along the third surface 613. The second carriage 612 and the third carriage 614 are configured to move in the x-direction next to edge 617 of the first surface 602. Each carriage 610, 612, 614 can include a tongue 625 designed to engage the corresponding groove 605, 615, as shown in FIG. 8A. The tongue 625 can form a dovetail connection with the corresponding groove 605, 615. In the illustrated embodiments, the tongue 625 on the bottom of the carriages 610, 612, 614 can mate with grooves 605, 615 of the test platform 601, but other methods to couple the carriages 610, 612, 614 to the test platform 601 and to allow the carriages 610, 612, 614 to translate in the x-direction along the test platform 601 are contemplated.

In some embodiments, the system includes only the first carriage 610. In other embodiments, the system includes only the first carriage 610 and the second carriage 612. The carriages 610, 612 can be on opposite sides of the first surface 602 in the y-direction. In some embodiments, the system includes only the first carriage 610 and the third carriage 614. The carriages 610, 614 can be on opposite sides of the first surface 602 in the y-direction.

In the illustrated embodiment, two carriages 612, 614 are connected together. The second carriage 612 can be coupled to the third carriage 614. The second carriage 612 and the third carriage 614 can travel together in the x-direction along third surface 613, adjacent to the edge 617 of the first surface 602. The second carriage 612 and the third carriage 614 can be coupled at a fixed distance relative to each other. In some embodiments, the fixed distance can correspond to a distance D1 between adjacent crowns of a formed wire that extend beyond the edges 607, 617 of the first surface 602. In other embodiments, the fixed distance can correspond to a distance D2 between a first crown and a third crown of a formed wire. In other embodiments, the fixed distance can correspond to the distance between the first crown and a fifth crown of a formed wire.

Referring to FIGS. 5A-6B, the first carriage 610, the second carriage 612, and the third carriage 614 are coupled to a motor 616. In some embodiments, each carriage 610, 612, 614 is driven by a separate motor. In some embodiments, the first carriage 610 is driven by a motor and both the second carriage 612 and the third carriage 614 are driven by a different motor. In the illustrated embodiment, the motor 616 is connected to a pulley and belt system 620.

The pulley and belt system 620 includes two belts 621, 623 located on Side A, Side B of the test platform 601 and four pulleys located near the corners of the test platform 601. The first carriage 610 can be coupled to the belt 621 on Side A. The second carriage 612 and the third carriage 614 can be coupled to the belt 623 on Side B. Rotation of the motor 616 causes rotational movement of the belts 621, 623, thereby causing translational movement of the carriages 610, 612, 614 in a first x-direction along the second surface 603 and the third surface 613. Rotation of the motor 616 in the opposite direction causes translational movement of the carriages 610, 612, 614 in a second, opposite x-direction along the second surface 603 and the third surface 613. When the motor 616 is rotated, the first carriage 610, the second carriage 612, and the third carriage 614 can move between a first end 624 and a second end 626 of the system (shown in FIGS. 5A and 5B). In some embodiments, the first carriage 610 can be calibrated to travel at the same speed as the second carriage 612. In some embodiments, the first carriage 610 can be calibrated to travel at a slower speed than the second carriage 612.

The system can include one or more wire clamps 634. The wire clamp 634 can prevent movement of the formed wire or wires relative to the first surface 602. The wire clamp 634 can hold the formed wire or wires against the first surface 602. In the illustrated embodiment, the system includes a wire clamp 634 at the first end 624 of the system and another wire clamp 634 at the second end 626 of the system. Other configurations of subsystems to maintain the position of the formed wire or wires are contemplated. The system can include a hipot tester 640, as described herein.

Referring to FIGS. 5A-6B, the carriages 610, 612, 614 can translate in the x-direction via the pulley and belt system 620 and the motor 616. The carriages 610, 612, 614 can be guided by the grooves 605, 615 on the second and third surfaces 603, 613. As the carriages 610, 612, 614 translate in the x-direction along the test platform 601, the carriages 610, 612, 614 interact with the crowns of formed wire or wires 600 which extend beyond the edges 607, 617 of the first surface 602. As described herein, the carriages 610, 612, 614 can include one or more electrically conductive brushes. The movement of the carriages 610, 612, 614 in the x-direction causes the electrically conductive brushes to sweep across the formed wire or wires. The one or more electrically conductive brushes of the carriages 610, 612, 614 can contact different portions of the formed wire or wires as the carriages 610, 612, 614 move in the x-direction, and can sequentially test electrically insulating coating on these portions as the one or more electrically conductive brushes move along the formed wire or wires.

FIG. 6A illustrates an example of electrical connections of the system for testing electrically insulating coating of a formed wire. FIG. 6B illustrates an example of the electrical connections of a system for testing electrically insulating coating of a plurality of formed wires. The system can include the hipot tester 640. In the illustrated embodiment, the hipot tester 640 can include a power supply. The hipot tester 640 can generate high DC voltage, as described herein. The generated voltage can be between 500 Vdc and 1500 Vdc. The supplied voltage can be approximately 500 Vdc, 600 Vdc, 700 Vdc, 800 Vdc, 900 Vdc, 1000 Vdc, 1100 Vdc, 1200 Vdc, 1300 Vdc, 1400 Vdc, 1500 Vdc, between 500-750 Vdc, between 750-1000 Vdc, between 1000-1250 Vdc, between 1250-1500 Vdc. The hipot tester 640 can be considered a power source. The hipot tester 640 can generate high voltage. In some embodiments, the hipot tester 640 can generate DC voltage. Electrical potential is established by the hipot tester 640. The hipot tester 640 can include a power input (not shown) such as an electrical connection to a power source, such as an electrical wall outlet. The hipot tester 640 can include a rectifier to convert the AC voltage to DC voltage or other type of adaptor.

The hipot tester 640 can perform dielectric testing of the formed wire or wires. The hipot tester 640 can include one or more terminals 642. When connected to components of the system, the terminals 642 establish an electrical potential between components of the system. In one non-limiting example described below, electrical connection to the hipot tester 640 establishes an approximately 1000 volt electrical potential on electrically conductive brushes housed in the carriages 610, 612, 614, as described herein. Electrically connecting a voltage terminal 642 of the hipot tester 640 to the electrically conductive brushes establishes an electrical potential on the one or more brushes, as described herein. In the illustrated example, the hipot tester 640 delivers a voltage of fixed polarity to one or more electrically conductive brushes in each carriage 610, 612, 614. The terminals 642 can be considered a high voltage junction between the hipot tester 640 and the electrically conductive brushes housed in the carriages 610, 612, 614.

The hipot tester 640 can include one or more ground terminals 644, such as a floating ground terminal. A formed wire 600 can be electrically connected to a floating ground terminal via an electrical connector 645 including a clip 646 and a cable 647. In some embodiments, the system includes a single formed wire. The clip 646 connected to a ground terminal can be coupled to the single formed wire 600 of a plurality of formed wires 600. The electrical connector of a ground terminal 644 can be sequentially coupled to a single formed wire of the plurality of formed wires to electrically connect the single wire to a floating ground.

Figure 6C:
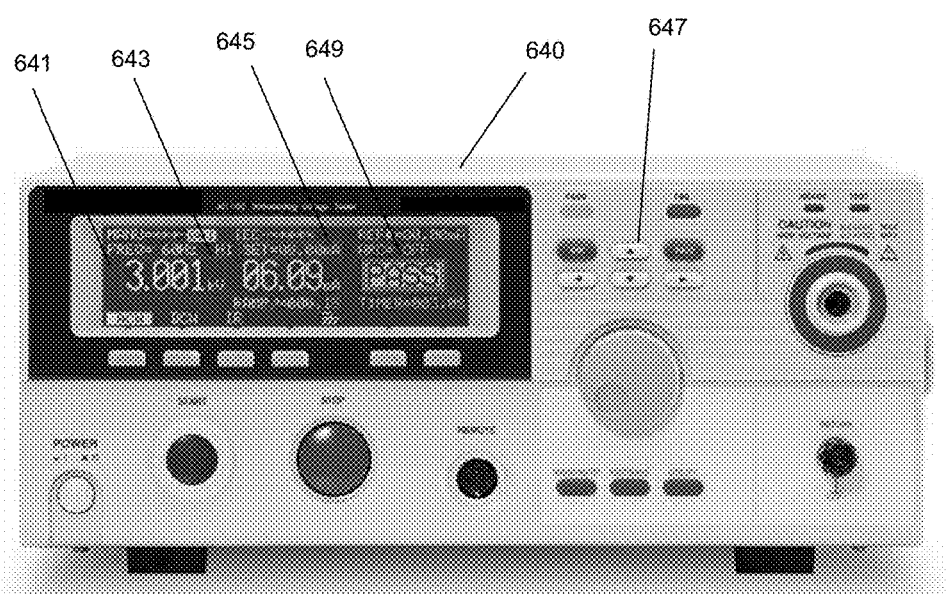
FIG. 6C illustrates a view of an example hipot tester.

FIG. 6C illustrates an embodiment of the hipot tester 640. The hipot tester 640 can be used in a method to evaluate insulation of the formed wire or wires, described herein. The hipot tester 640 can include a power source. As one example, the hipot tester 640 can supply high DC voltage to one or more conductive brushes. The hipot tester 640 can be electrically connected to the formed wire or wires. The hipot tester 640 can measure the leakage current. The hipot tester 640 can compare the leakage current to the reference value. The reference value can be an input into the hipot tester 640. The user can set the reference value prior to applying a voltage with the hipot tester 640.

The hipot tester 640 can include a display 641. The display 641 can provide a voltage output 643 corresponding to the applied voltage. The output can be expressed numerically, for instance 500 Vdc. The voltage output 643 can change as the applied voltage changes. The display 641 can provide a reference input 645 corresponding to the reference value, as described herein. The reference input 645 can indicate a limit or threshold of current for comparison with a measured current. The threshold current can include a threshold leakage current, and the measured current can include a measured leakage current. The reference input 645 can include a preset current leakage limit. The reference input 645 can include a predetermined or set current value corresponding to a formed wire having electrically insulating coating that does not include a defect. The reference input 645 can be an input provided by the user. The hipot tester 640 can include a user interface 647. The user interface 647 can include one or more buttons or dials which allow the user to input information into the hipot tester 640. The user can set the reference input 645 by using the user interface 647. The display 641 can provide a visual indication of the reference input 645. The reference input 645 can be expressed as a number, for instance 8 mA.

The hipot tester 640 can measure leakage current. The display 641 can provide an indicator of the measured leakage current. The display 641 can include a leakage current output 649. In some embodiments, not illustrated, the leakage current output 649 can be expressed as a number, for instance the value of the measured leakage current. As an example, a spike in the measured leakage current can indicate a defect in the formed wire or wires.

In some embodiments, the hipot tester 640 can compare the measured leakage current to the reference input 645. The display 641 can provide an indicator of the comparison between the measured leakage current and the reference input 645. In the illustrated embodiment, the leakage current output 649 can be a word, letter, or abbreviation (e.g., PASS, FAIL, P for pass, F for fail, - for pass, X for fail, etc.). In the illustrated embodiment, the leakage current output 649 can display the word "PASS" if the measured leakage current is below the reference input 645. The leakage current output 649 can display the word "FAIL" if the measured leakage current is above the reference input 645. The leakage current output 649 can change as the electrically conductive brushes move along the formed wire or wires. The leakage current output 649 can change during the period in which voltage is applied. The leakage current output 649 can provide information to the user regarding whether the tested formed wire or wires include a defect.

Implementations of the systems and methods described herein subject the formed wire or wires to a dielectric test to ensure that the formed wire or wires are functional prior to being inserted into the stator. Stator wires determined to be defective, using systems and methods described herein, can be discarded so that they are not introduced into windings that include multiple wires wound into complex structures and are eventually inserted into a stator. In some cases, the windings are tested a final time following insertion into the stator. Implementations of systems and methods described herein can detect a failure in a defective formed wire or wires before the final test of now-installed windings. The dielectric test can be considered an insulation test or a copper wire insulation test. The system configured to test a single formed wire can be considered a one phase test system. The system configured to test a plurality of formed wires can be considered a multiple phase test system. Each path can be considered a phase, such that multiple parallels paths correspond to multiple phases. In the illustrated embodiment, the multiple phase test system is shown with nine parallel paths. In other embodiments, the multiple phase test system consists of eighteen parallel paths.

Figure 7A:
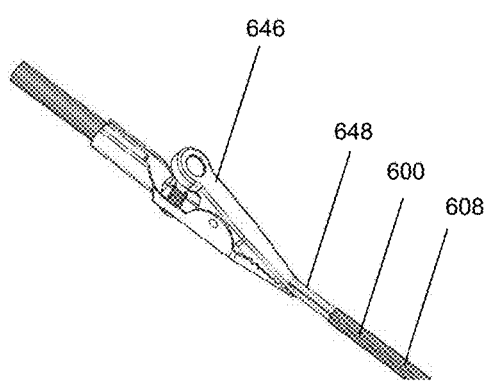
FIGS. 7A-7C illustrate a formed wire or a plurality of formed wires connected to a hipot tester.
Figure 7B:
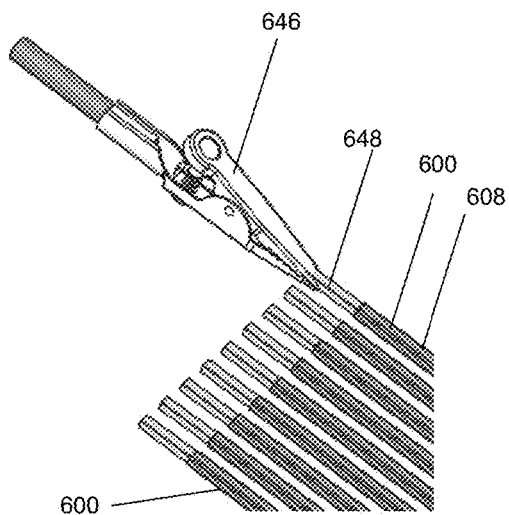

FIG. 7A and FIG. 7B show enlarged views of an electrical connector 645 including a clip 646 and a cable 647. In the illustrated embodiment, the formed wire or wires are each sequentially connected to a floating ground of the hipot tester 640 while the electrically conductive brushes housed in the carriages 610, 612, 614 remain connected to a single voltage terminal 642. In other embodiments, the formed wire or wires are each sequentially connected to a voltage terminal 642 of the hipot tester 640 while the electrically conductive brushes housed in the carriages 610, 612, 614 remain connected to a floating ground terminal of the hipot tester 640. For systems testing a single formed wire, the electrical connector 645 connected to a ground terminal can be coupled to the single formed wire as shown in FIG. 7A. For systems testing a plurality of formed wires, the electrical connector 645 connected to a ground terminal can be sequentially coupled to a single formed wire of the plurality of formed wires as shown in FIG. 7B. Alternatively, all the wires of a plurality of formed wires can be coupled in parallel to the hipot tester and all are tested at the same time with a single pass of the brushes.

The formed wires are continuous from the first end 624 of the test platform to the second end 626 of the test platform 601, as shown in FIGS. 5A and 5B. Each formed wire can include a first end 648. The electrically insulating coating 608 may not extend to the first end 648, such that a portion of the formed wire near the first end 648 is exposed to form an electrical connection with the electrical connector 645. The electrical connector 645 is configured to ground the conductor of the formed wire 600. For example, the first end 648 of the formed wire can be grounded through an electrical connection to a floating ground terminal of the hipot tester 640. As shown in FIG. 7B, each of the nine formed wires can be sequentially grounded as each wire is tested for defects using methods described herein.

Figure 7C:
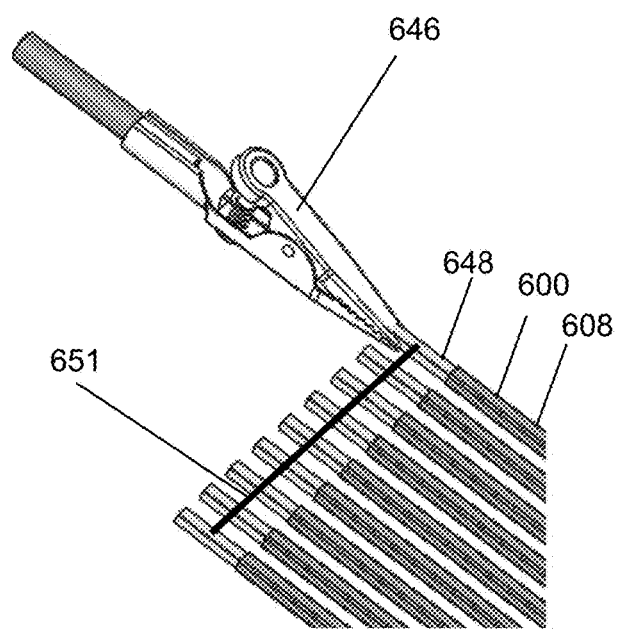

FIG. 7C illustrates a cross-bar 651. The cross-bar 651 can be positioned adjacent to a surface of two or more formed wires. In the illustrated embodiment, the cross-bar 651 is positioned adjacent to a top surface of the formed wires. In some embodiments, the cross-bar 651 is positioned adjacent to a bottom surface of the formed wires. In some embodiments, the cross-bar 651 is positioned adjacent to both the top and bottom surface of the formed wires.

The cross-bar 651 can electrically couple two or more formed wires. In the illustrated embodiment, all formed wires are connected to the same floating ground of the hipot tester 640 while the electrically conductive brushes housed in the carriages 610, 612, 614 remain connected to a single voltage terminal 642. In the illustrated embodiment, all the wires of a plurality of formed wires are electrically coupled in parallel through the cross-bar 651 to the hipot tester and all are tested at the same time with a single pass of the brushes. As shown in FIG. 7C, each of the nine formed wires can be grounded as the plurality of formed wires is tested for defects using methods described herein. In some embodiments, the cross-bar 651 is a conductive material, such as metal. In some embodiments, the cross-bar 651 applies a compressive force or clamp to two or more formed wires. In some methods of use, the clip 646 can be coupled to any of the formed wires electrically coupled via the cross-bar 651. In the illustrated embodiment, the clip 646 can be attached to any of the nine formed wires. In some embodiments, the clip 646 and the cross-bar 651 are integrally formed.

FIG. 8A illustrates an enlarged view the first carriage 610. The second carriage 612 and the third carriage 614 can be similar or identical to the first carriage 610. The second carriage 612 and the third carriage 614 can include one or more of the following features. The first carriage 610 includes a housing 650. The illustrated housing 650 has two sides forming an L-shaped design, but other configurations are possible. The housing 650 has an open first side 652, an open second side 654, and an open third side 656. The open first side 652 and open second side 654 allow the first carriage 610 to move between the first end 624 of the system and the second end 626 of the system. As shown in FIGS. 5A-6B, the carriage 610 can move within the groove 605 between the first end 624 and the second end 626. The carriage 610 can include a tongue 625 designed to slide within the groove 605 of the test platform 601. The open third side 656 allows the carriage to accept the formed wire within the housing 650.

The first carriage 610 can include one or more conductors configured to establish an electric current between the hipot tester 640 and the formed wires 600. In the example illustrated in FIG. 8A, the conductors include brushes 660 having electrically conductive bristles 670. In the illustrated embodiment, the first carriage 610 includes the brush 660 including a first bristle portion 662 and a second bristle portion 664. The first bristle portion 662 can be coupled to the housing 650. The second bristle portion 664 can be coupled to a platform 668 within the housing 650. The platform 668 can be designed to slide relative to the second surface 603. The platform 668 can be designed to fit within the undercut 604 to position the one or more brushes 660 adjacent to a plurality of bent segments, such as the crowns, of the formed wire or wires. The platform 668 can increase stability of the first carriage 610. The platform 668 can be disposed under the crown of the formed wire or wires as the carriage 610 translates along the test platform 601.

In the illustrated embodiment, the free ends of the first bristle portion 662 do not overlap with the free ends of the second bristle portion 664. The free ends of the first bristle portion 662 can form a passageway with the free ends of the second bristle portion 664. The first bristle portion 662 and the second bristle portion 664 can be non-contacting. The first bristle portion 662 and the second bristle portion 664 can be opposing. The brush 660 can include two or more opposing bristle portions. The first bristle portion 662 can be configured to sweep over a top side of a plurality of bent segments of the stator wire, and the second bristle portion 664 can be configured to simultaneously sweep over a bottom side of the plurality of bent segments.

The first carriage 610 can include a connector 618 to connect the bristle portions 662, 664 of the brush 660 to a voltage terminal 642 of the hipot tester 640. A cable 619 can establish the electrical connection between the connector 618 and the voltage terminal 642 of the hipot tester. Electric potential is established by the hipot tester 640. As described herein, the hipot tester 640 can be a direct current type. The electrical potential established on the brush 660 may be equal to approximately 500 volts. The electrical potential established on the brush 660 may be equal to approximately 750 volts. The electrical potential established on the brush 660 may be equal to approximately 1000 volts. The electrical potential established on the brush 660 may be less than approximately 1000 volts (e.g., between 250 volts and 500 volts, between 500 volts and 750 volts, between 750 volts and 1000 volts, between 1000 volts and 1250 volts, between 1250 volts and 1500 volts, etc.).

The bristle portions 662, 664 can include features configured to perform the function of sweeping over the formed wire or wires. In some embodiments, the bristle portions 662, 664 are flexible. The bristle portions 662, 664 or portions thereof can comprise any suitable conductive material, which can be a metal such as aluminum, brass, copper, tin, or an alloy thereof. In some embodiments, the entire surface of the bristle portions 662, 664 is conductive. In other embodiments, a portion near the free ends of the bristle portions 662, 664 is conductive.

Figure 8B:
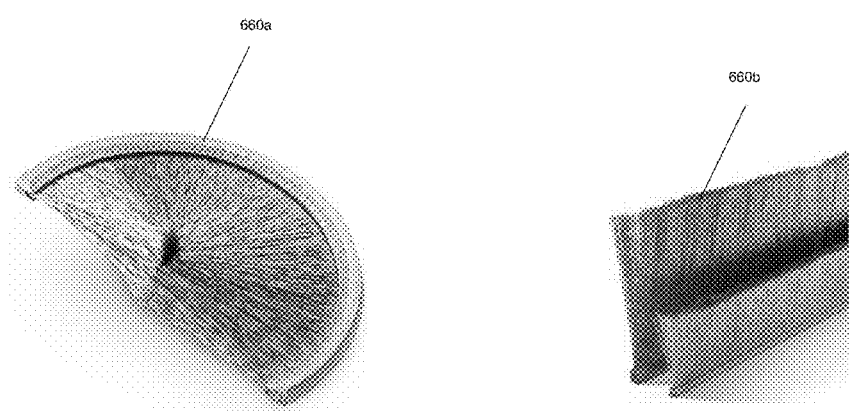
FIG. 8B illustrates additional example conductors in a first carriage of the system.

FIG. 8B illustrates alternative example conductors 660*a* and 660*b* that can be included in carriages described herein to establish an electric current between the hipot tester 640 and the formed wires 600. Suitable conductors can include a bristle, a brush, a fiber, a woven cloth, and a non-woven cloth. The shape and design of the conductor can be selected to maximize contact between the conductor and portions of the wires 600 as the conductor passes over the wires 600.

In an optimal situation, the bristle portions 662, 664 of the brush 660 can contact only the electrically insulating coating of the formed wire 600. In some embodiments, the hipot tester 640 includes a processor. In some embodiments, the hipot tester 640 is connected to a component that includes a processor, such as a computer. The processor is programmed to determine the value of electrical current that is conducted through the formed wire when the brush contacts the electrically insulating coating of the formed wire (and does not contact the conductor of the formed wire). The value of electrical current can be, for example, a value of electrical leakage current that is conducted through the formed wire when the brush contacts a non-defective segment of electrically insulating coating of the formed wire (and therefore does not contact the conductor of the formed wire). In some methods of use, this value can be considered a reference value or pre-determined current value. In some methods of use, a reference value is established for each wire of a plurality of formed wires. In some methods of use, a single reference value is use for all formed wires of a plurality of formed wires. In some methods of use, the reference value represents a maximum threshold value of electrical current that may be conducted through the formed wire or wires which has an intact (i.e., not damaged) electrically insulating coating. In some examples, the reference value represents a maximum allowable electrical current that is compared to an actual electrical current measured during testing of the formed wire, such that an actual measured electrical current that exceeds the reference value indicates that the formed wire includes a defect of sufficient degree that it does not pass dielectric testing. Formed wires determined to fail dielectric testing at this stage can be advantageously discarded and will not be included in a winding structure for insertion into a stator.

In some methods of use, the reference value is determined by testing a segment of the formed wire or wires. As one example, the brushes can sweep a straight or substantially straight segment of the formed wire or wires. In other methods of use, the reference value is calculated from known values. The known values can include one or more of the expected resistance of the conductor, the measured resistance of the conductor, the density of the conductor, the cross-sectional area of the conductor, gauge of the conductor, length of the conductor, resistivity of the material of the conductor, and the applied voltage. An expected resistance of a single wire/loop conductor can be, for example, about 1 milli-ohm to about 3 mill-ohms. An example cross section of a conductor can be about 2 millimeters by about 5 millimeters. An example length of the conductor can be about 1300 millimeters. An example resistivity of the material of the conductor can be about 1.71E-08 Ohm-meter. An example applied voltage can be 500 Vdc to 1500 Vdc. The reference value can be a value determined from mathematical calculations.

In the case of failure of the electrically insulating coating, the conductive bristle portions 662, 664 of the brush 660 contact the conductor of the formed wire. The voltage supplied to the brush 660 can travel to the first end 648 of the formed wire creating an increase in current through the circuit including a voltage terminal of the hipot tester 640, the brush 660, the formed wire 600, and a ground terminal of the hipot tester connected to the formed wire 600. Electrical contact between the brush 660 and exposed metal in an area where the electrically insulating coating has failed on the formed wire 600 thus results in a change in the electrical current flowing in the circuit. The resulting changing in the current flow is measurable, and in some cases includes a current spike, when the brush 660 makes electrical contact with exposed metal on the formed wire, indicating a failure, such as a defect, in the electrically insulating coating in that area.

In some embodiments, the processor is configured to compare the value of the electrical current conducted through the formed wires and the reference value. In some embodiments, the processor is configured to assess the electrical current. As one example, a formed wire with a value of electrical current equal to or less than the reference value can be considered acceptable (i.e., the wire would be considered functional upon installation in a stator). As one example, a formed wire with a value of electrical current greater than the reference value can be considered unacceptable (i.e., the formed wire would be considered non-functional upon installation in a stator). As one example, the processor can provide an indication that allows a user to reject a formed wire or wires if the electrical current conducted through the formed wire or wires is greater than the reference value. As one example, the processor can indicate that the formed wire or wires have a damaged or defective electrically insulating coating.

In some embodiments, the processor is configured to gather measurements from one or more of the following: the hipot tester, a formed wire, formed wires, a bristle portion, a brush, a carriage, or two or more carriages. In some embodiments, the processor is configured to perform calculations to determine the value of electrical current. In some embodiments, the processor is configured to compare the value of electrical current to a reference value of electrical current. In some embodiments, the processor is configured to transmit information to the user regarding one or more of the following: the value of electrical current, the reference value of electrical current, the quality of the insulation of the formed wire or wires, or whether the electrically insulating coating includes a defect. In some embodiments, the processor is configured to display information. In some embodiments, the processor is configured to determine which wire of a plurality of formed wires is defective. In some embodiments, the processor is configured to determine the location of the defect in the formed wire or wires and to output a signal indicative of the location of the signal. In some embodiments, the processor is configured to aggregate data regarding two or more defects of the electrically insulating coating.

Figure 9:
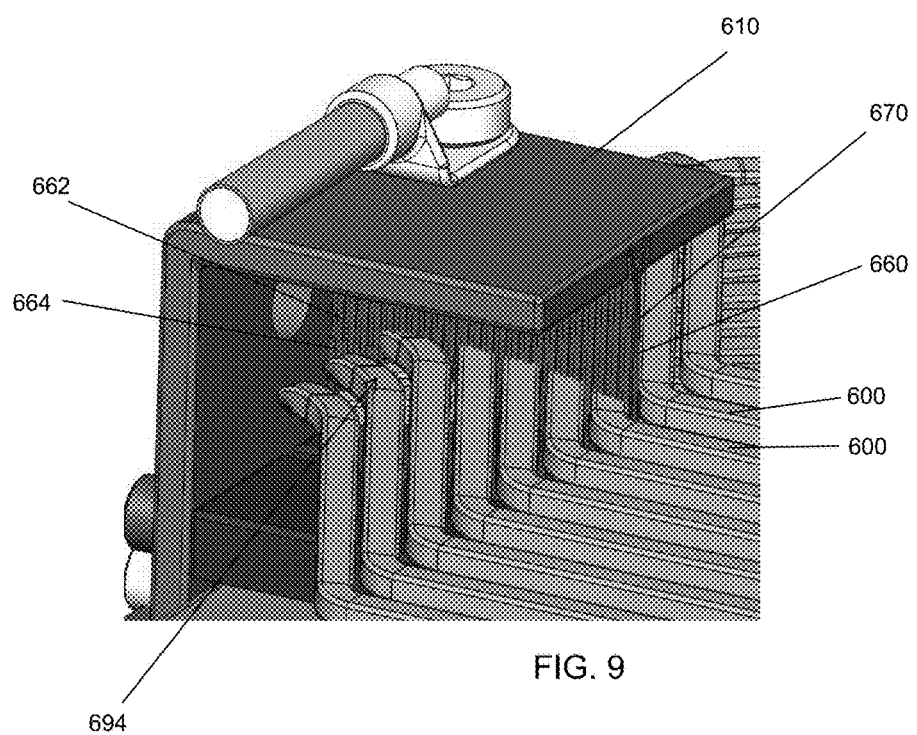
FIG. 9 illustrates the first carriage of the system interacting with the formed wires of FIG. 6B.

FIG. 9 illustrates the first carriage 610 being passed along the formed wires 600. The formed wire or wires pass between the free ends of the first bristle portion 662 and the free ends of the second bristle portion 664. As the formed wire or wires pass through the bristle portions 662, 664, the free ends of the bristle portions 662, 664 contact the external surfaces of the formed wire or wires. FIG. 9 shows that each free end of the bristle portions 662, 664 substantially surrounds a portion of each formed wire or wires. In some embodiments, each bristle portion 662, 664 surrounds approximately half of each formed wire or wires. Each bristle portion can contact one or more formed wires 600 (e.g., one formed wire, two formed wires, three formed wires, four formed wires, five formed wires, six formed wires, seven formed wires, eight formed wires, nine formed wires, ten formed wires, eleven formed wires, twelve formed wires, thirteen formed wires, fourteen formed wires, fifteen formed wires, sixteen formed wires, seventeen formed wires, eighteen formed wires, nineteen formed wires, twenty formed wires, a portion of the formed wires, all of the formed wires, etc.). In the illustrated embodiment, the bristle portions 662, 664 can contact up to six formed wires 600.

Each bristle portion 662, 664 comprises one or more bristles 670. In the illustrated embodiment, each bristle portion 662, 664 comprise a plurality of bristles (e.g., ten, twenty, thirty, forty, fifty, sixty, greater than ten, greater than twenty, greater that thirty, greater than forty, greater that fifty, greater than sixty, etc.). The bristles can be arranged in a single line or a plurality of lines. The bristles 670 of each bristle portion 662, 664 can extend along the crown of the formed wire or wires. The bristles 670 of each bristle portion 662, 664 can extend along the substantially straight or straight segment of the formed wire or wires or a portion thereof. In some embodiments, the bristles 670 of each bristle portion 662, 664 can extend along all of the bends of the formed wire or wires.

In the illustrated system, two bristle portions 662, 664 are shown. Other configurations are contemplated. The brush 660 can include only one bristle portion. The brush 660 can include two or more bristle portions (e.g., two bristle portions, three bristle portions, four bristle portions, five bristle portions, six bristle portions, seven bristle portions, eight bristle portions, nine bristle portions, ten bristle portions, etc.). The bristles 670 of each bristle portion can include a similar dimension (e.g., length, height, thickness), similar material, similar orientation, similar connection point to the first carriage 610, or other similar feature. The bristles 670 of each bristle portion can include different dimensions (e.g., length, height, thickness), different material, different orientation, different connection point to the first carriage 610, or other different feature. In some embodiments, the bristles 670 of each bristle portion can have at least one common feature.

The bristles 670 can include features configured to perform the function of sweeping over the formed wire or wires. In some embodiments, the bristles 670 are flexible. The bristles 670 or portions thereof can comprise any suitable conductive material, which can be a metal such as aluminum, brass, copper, tin, or an alloy thereof. In some embodiments, the entire surface of the bristles 670 is conductive.

In the illustrated embodiment, the brush 660 is substantially linear. The bristles 670 of the first portion 662 are coupled to the housing 650 in a straight or substantially straight line. The bristles 670 of the second portion 664 are coupled to the platform 668 in a straight or substantially straight line. In some embodiments, the longitudinal axes of two or more bristles 670 of a bristle portion 662, 664 are skewed relative to each other. In some embodiments, the longitudinal axes of two or more bristles 670 of a bristle portion 662, 664 are contained on different planes. In some embodiments, the longitudinal axes of two or more bristles 670 of a bristle portion 662, 664 are perpendicular. In some embodiments, the longitudinal axes of two or more bristles 670 of a bristle portion 662, 664 are arranged in a radial configuration. In some embodiments, the housing 650 can form a curved shape such as a semi-circle or helix. The longitudinal axes of two or more bristles 670 of a bristle portion 662, 664 are arranged in a radial configuration within this curved shape of the housing. In some embodiments, two or more bristles 670 of a bristle portion 662, 664 form a spiral. In some embodiments, two or more bristles 670 of a bristle portion 662, 664 have two or more lengths.

Figure 10:
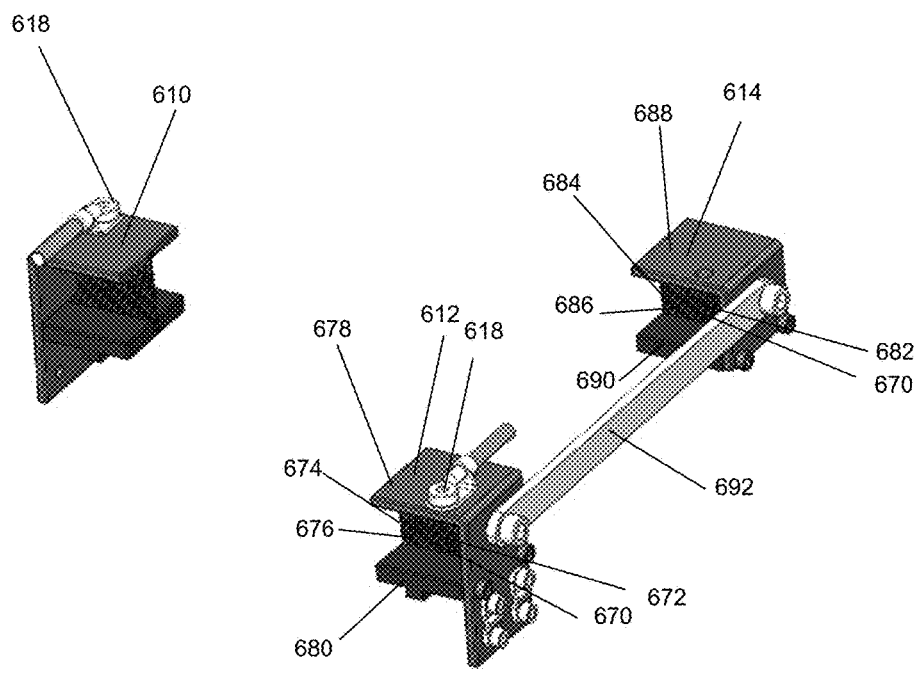
FIG. 10 illustrates the carriages of the system.

FIG. 10 illustrates the first carriage 610, the second carriage 612, and the third carriage 614 removed from the system. The first carriage 610 and the second carriage 612 can be connected to the hipot tester 640 via connectors 648. The third carriage 614, if present, can be connected to the hipot tester 640 via a connector (not shown).

The second carriage 612 can include one or more brushes 672. In the illustrated embodiment, the second carriage 612 includes the brush 672 including a first bristle portion 674 and a second bristle portion 676. The first bristle portion 674 can be coupled to a housing 678 of the second carriage 612. The second bristle portion 676 can be coupled to a platform 680 within the housing 678. The platform 680 can be designed to slide relative to the third surface 613. The platform 680 can be designed to fit within the undercut 606 to position the one or more brushes 672 adjacent to a plurality of bent segments, such as the crowns, of the formed wire or wires.

The second carriage 612 is configured to be passed along the formed wires, similar to the first carriage 610 shown in FIG. 9. The second carriage 612 can include a connector 618 to connect the bristle portions 674, 676 of the brush 672 to a terminal of the hipot tester 640. Electric potential is established by the hipot tester 640 across the brush 672. In some embodiments, the free ends of the first bristle portion 674 do not overlap with the free ends of the second bristle portion 676. The free ends of the first bristle portion 674 can form a passageway with the free ends of the second bristle portion 676. The first bristle portion 674 and the second bristle portion 676 can be non-contacting. The first bristle portion 674 and the second bristle portion 676 can be opposing. The brush 672 can include two or more opposing bristle portions. The first bristle portion 674 and the second bristle portion 676 can have any of the features of the first bristle portion 662 and the second bristle portion 664 described herein in relation to the first carriage 610. The first bristle portion 674 and the second bristle portion 676 can include bristles 670, as described herein.

The third carriage 614, if present, can include one or more brushes 682. In the illustrated embodiment, the third carriage 614 includes the brush 682 including a first bristle portion 684 and a second bristle portion 686. The first bristle portion 684 can be coupled to a housing 688 of the third carriage 614. The second bristle portion 686 can be coupled to a platform 690 within the housing 688. The platform 690 can be designed to slide relative to the third surface 613. The platform 690 can be designed to fit within the undercut 606 to position the one or more brushes 682 adjacent to a plurality of bent segments, such as the crowns, of the formed wire or wires.

The third carriage 614 is configured to be passed along the formed wires, similar to the first carriage 610 shown in FIG. 9. The third carriage 614 can include a connector 618 (not shown) to connect the bristle portions 684, 686 of the brush 682 to a terminal of the hipot tester 640. Electric potential is established by the hipot tester 640 across the brush 682. In some embodiments, the free ends of the first bristle portion 684 do not overlap with the free ends of the second bristle portion 686. The free ends of the first bristle portion 684 can form a passageway with the free ends of the second bristle portion 686. The first bristle portion 684 and the second bristle portion 686 can be non-contacting. The first bristle portion 684 and the second bristle portion 686 can be opposing. The brush 682 can include two or more opposing bristle portions. The first bristle portion 684 and the second bristle portion 686 can have any of the features of the first bristle portion 662 and the second bristle portion 664 described herein in relation to the first carriage 610. The first bristle portion 684 and the second bristle portion 686 can include bristles 670, as described herein. The second carriage 612 and the third carriage 614 can be rigidly coupled via a bar 692. In some examples, the first carriage 610, the second carriage 612, and the third carriage 614 simultaneously translate along a plurality of bent segments of the stator wire.

Figure 11:
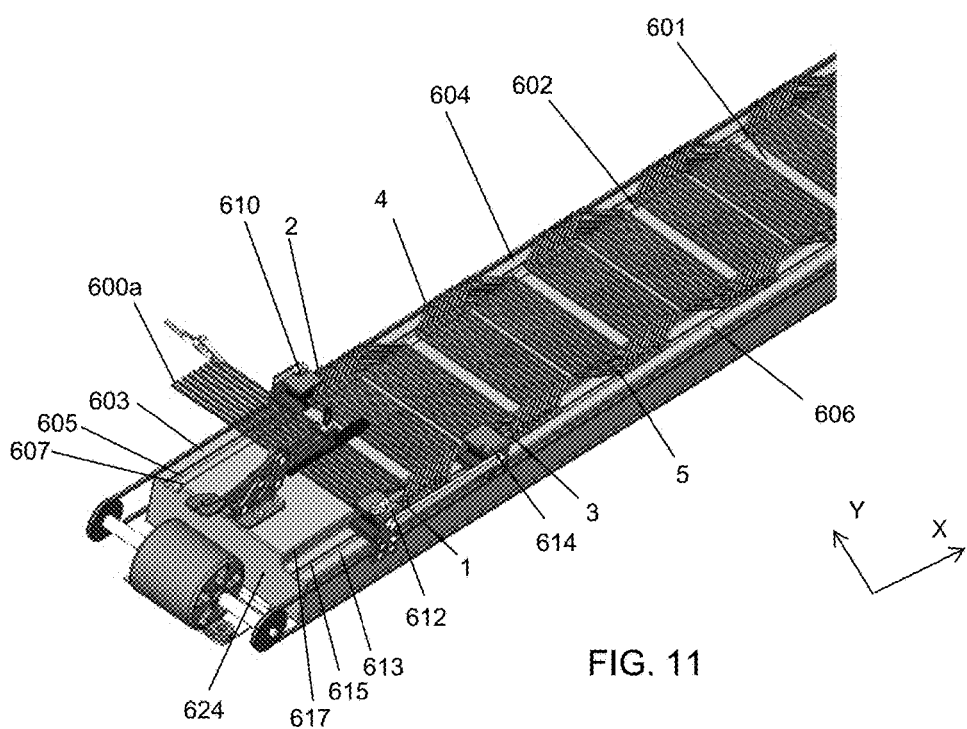
FIG. 11 illustrates the first location of the system.

FIG. 11 illustrates the system with the first carriage 610, the second carriage 612, and the third carriage 614 in a first location. The first location can be near the first end 624 of the test platform 601. The first location can include one or more of the following features. The first carriage 610 can be located adjacent to the edge 607. The first carriage 610 can be located adjacent to the second surface 603. The tongue 625 of the first carriage 610 can be located within the groove 605 for movement in the x-direction. The platform 668 of the first carriage 610 can be located within the undercut 604 to position the brush 660 to sweep across the formed wire or wires. The second carriage 612 can be located adjacent to the edge 617. The second carriage 612 can be located adjacent to the third surface 613. The tongue of the second carriage 612 can be located within the groove 615 for movement in the x-direction. The platform 680 of the second carriage 612 can be located within the undercut 606 to position the brush 672 to sweep across the formed wire or wires. The third carriage 614 can be located adjacent to the edge 617. The third carriage 614 can be located adjacent to the third surface 613. The tongue of the third carriage 614 can be located within the groove 615 for movement in the x-direction. The platform 690 of the third carriage 614 can be located within the undercut 606 to position the brush 682 to sweep across the formed wire or wires.

Referring to FIG. 11, the second carriage 612 can be adjacent to the first crown 1 of the formed wire 600a. The first carriage 610 can be adjacent to the second crown 2 of the formed wire 600a. The third carriage 614 can be adjacent to the third crown 3 of the formed wire 600a. The first carriage 610, the second carriage 612, and the third carriage 614 can move in the x-direction toward the second end 626 of the system. The second carriage 612 can move toward the third crown 3 of the formed wire 600a. The first carriage 610 can move toward the fourth crown 4 of the formed wire 600a. The third carriage 614 can move toward the fifth crown 5 of the formed wire 600a. In some methods of use, all of the even numbered crowns can be passed over by the first carriage 610 (e.g., second crown, forth crown, sixth crown, eighth crown, tenth crown, twelfth crown, fourteenth crown, sixteenth crown, eighteenth crown, twentieth crown, etc.). In some methods of use, all of the odd numbered crowns can be passed over by the second carriage 612, the third carriage 614 or both the second carriage 612 and the third carriage (e.g., first crown, third crown, fifth crown, seventh crown, ninth crown, eleventh crown, thirteenth crown, fifteenth crown, seventeenth crown, nineteenth crown, etc.). In some non-limiting examples, the second carriage 612 is the only carriage that passes over the first crown of the formed wire or wires.

Figure 12:
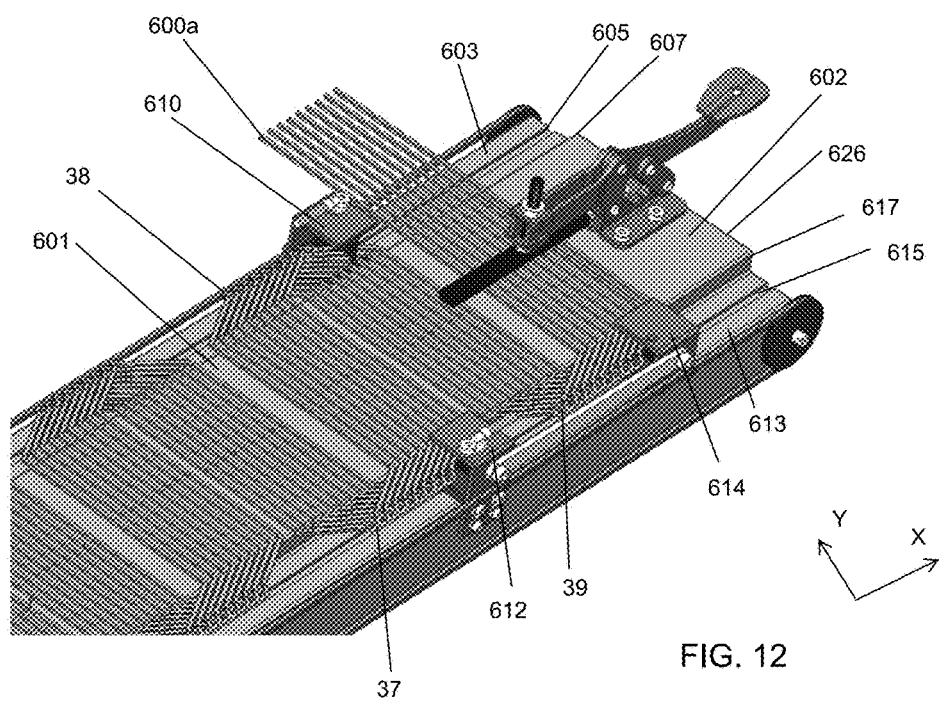
FIG. 12 illustrates the second location of the system.

FIG. 12 illustrates the system with the first carriage 610, the second carriage 612, and the third carriage 614 in a second location. The second location can be near the second end 626 of the test platform 601. The second location can includes one or more of the following features. The third carriage 614 can be adjacent to the last crown of the formed wire 600a. In the illustrated embodiment, the third carriage 614 can be adjacent to the thirty-ninth crown 39 of the formed wire 600a. The first carriage 610 can be adjacent to the next to last crown of the formed wire 600a. In the illustrated embodiment, the first carriage 610 can be adjacent to the thirty-eighth crown 38 of the formed wire 600a. The second carriage 612 can be adjacent to the second to last crown of the formed wire 600a. In the illustrated embodiment, the second carriage 612 can be adjacent to the thirty-seventh crown 37 of the formed wire 600a. The third carriage 614 can be the only carriage that passes over the last crown of the formed wire or formed wires. When the first carriage, the second carriage 612, and the third carriage 614 have progressed to the second location, every crown will have been passed over by at least one of the first carriage 610, the second carriage 612, or the third carriage 614. In some methods of use, some crowns are passed over by two or more carriages 612, 614. The implementation illustrated in FIG. 12 also demonstrates that the position of the crowns of formed wire 600a relative to crowns of other wires 600 can change between first end 624 and second end 626. In the non-limiting embodiment illustrated in FIG. 12, for example, the thirty-ninth crown 39 of formed wire 600a is the uppermost crown of the thirty-ninth crowns of the nine wires 600 stacked on the substrate 602, whereas the thirty-eighth crown 38 of formed wire 600a is the lowermost crown of the thirty-eighth crowns of the nine wires 600 stacked on the substrate 602. The thirty-seventh crown 37 of formed wire 600a is again the uppermost crown of the thirty-seventh crowns of the nine wires 600 stacked on the substrate 602. The alternating position of the crowns of formed wire 600a can continue in this manner toward first end 624. The alternating position of the crowns of the formed wires 600 stacked on the substrate 602 can affect slot s when the nine wires 600 are later installed in a stator in accordance with embodiments described herein. Following insulation testing of all nine wires in the configuration illustrated in FIG. 12 and installation of all nine tested wires in a stator, successive crowns of the formed wire 600a may alternate between an inner layer and an outer layer of circular windings, such as inner layer 125 and outer layer 120 of circular windings illustrated in FIGS. 1A and 1B.

The systems described herein can be automatic. The first carriage 610, the second carriage 612, and the third carriage 614 can automatically move from the first end 624 to the second end 626 of the test platform 601. The first carriage 610, the second carriage 612, and the third carriage 614 can move via one or motors. In the illustrated embodiment, the motor controls a series of belts which move the first carriage 610, the second carriage 612, and the third carriage 614. Other configurations of moving the carriages 610, 612, 614 are contemplated (e.g., linear motors, stepper motors, belt drives, chains, rollers, pulleys, single motor, multiple motors, etc.).

The system can include a plurality of carriages (e.g., one, two, three, four, five, six, seven, eight, nine, ten, more than one, more than two, more than three, more than four, more than five, more than ten, more than fifteen, etc.). Two or more carriages can have the same configuration of brushes. Two or more carriages can have different configurations of one or more brushes. Two or more carriages can have the same configuration of one or more bristle portions. Two or more carriages can have different configurations of one or more bristle portions.

Exemplary Methods and Method Steps

The method can include the step of forming a wire. The method can include the step of forming a bend. The method can include the step of forming a compound bend. The method can include the step of forming two or more bends that lie on different planes. The method can include the step of forming two or more bends in different directions. The method can include the step of forming a v-shaped bend. The method can include the step forming an s-shaped bend.

The method can include the step of providing a formed wire. The formed wire can include a conductor. The conductor can have a cross-section defining at least one exterior surface of the conductor. The conductor can have a plurality of linear or substantially linear segments formed in the conductor. The conductor can have at least one crown formed in the conductor. The conductor can have a plurality of crowns formed in the conductor. The crown can have at least one bent segment. The crown can connect successive segments of the plurality of linear or substantially linear segments. The formed wire can include an electrically insulating coating. The method can include the step of applying the electrically insulating coating to the conductor. The method can include the step of applying the electrically insulating coating to the conductor before bending the formed wire. The method can include the step of applying the electrically insulating coating to the conductor after bending the formed wire. The electrically insulating coating can surround at least a portion of the conductor.

The method can include the step of placing a formed wire on a surface. The method can include the step of placing two or more formed wires on a surface. The method can include placing the formed wire on the surface such that one or more bends of the wire extend past an edge of the surface.

In some methods, nine formed wires are placed on the surface. In some methods of use, two or more formed wires overlap on the surface. The method can include the step of arranging the two or more formed wires such that the bends of the two or more wires do not overlap. In some methods, each of the two or more formed wires includes a peak. The method can include the step of arranging the two or more formed wires such that the peaks do not overlap. The method can include the step of arranging the two or more formed wires such that all bends of adjacent formed wires are exposed.

The method can include the step of evaluating the electrically insulating coating. The method can include the step of establishing an electrical current between a brush and a conductor of a wire to which electrically insulating coating has been applied. The brush can include two or more bristle portions.

The method can include the step of moving the brush. The method can include moving the brush linearly. The method can include moving the brush along the crown of the formed wire. The method can include moving the brush along the crown of two or more formed wires. The method can include the step of moving a first portion of the brush over the formed wire and a second portion of the brush below the formed wire.

The method can include the step of moving one or more carriages. In some embodiments, each carriage includes a brush. In some embodiments, two or more carriages are coupled together. In some embodiments, two or more carriages simultaneously move. In some embodiments, three carriages simultaneously move. In some embodiments, two or more carriages independently move. In some embodiments, all carriages independently move. In some embodiments, two or more carriages automatically move. In some embodiments, all carriages automatically move. In some embodiments, all carriages are driven by the same motor. In some embodiments, the electrical potential is established across all brushes in the two or more carriages as they move.

The method can include the step of determining a value of electrical current that is conducted through the conductor. The electrical current can include an electrical leakage current. The method can include the step of determining a spike in current. The method can include the step of determining if an amount of electrical leakage current conducted through the formed wire has changed from a reference value.

The method can include the step of generating and measuring an increase in electrical current through the conductor if the electrically insulating coating of the formed wire includes a defect. The defect can include a crack, a manufacturing defect, a failure at a bend, or a failure at a crown. The method can include the step of generating and measuring an increase in electrical current through the conductor if the conductor is exposed through a defect in the electrically insulating coating.

The method can include the step of comparing the value of electrical current conducted through the formed wire with a reference value. In some embodiments, the reference value is established by testing. In some embodiments, the reference value is established by mathematical calculations. In some embodiments, the reference value is a threshold level. The method can include the step of determining the reference value based on testing a segment of the formed wire or wires. The method can include the step of sweeping the brush along a straight or substantially straight segment of the formed wire or wires to determine a reference value.

The method can include the step of discarding the formed wire if a defect is detected in that particular formed wire. The method can include the step of discarding all formed wires on the surface of a test system if a failure is detected in one formed wire on the surface. The method can include the step of providing a stator. The method can include the step of engaging one or more formed wires in slots of the stator after testing the formed wires for defects in electrically insulating coating. The method can include the step of engaging the formed wires in the teeth of the stator.

Implementing Systems and Terminology

Implementations disclosed herein provide systems and methods for evaluating failure of the electrically insulating coating of stator windings for an electric machine.

The systems and methods above have been described in general terms as an aid to understanding details of preferred embodiments of the present invention. Other preferred embodiments of the present include the described application for interior permanent magnet motors and for electric vehicles. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, the term "or" as used herein is generally intended to mean "and/or" unless otherwise indicated. Combinations of components or steps will also be considered as being noted, where terminology is foreseen as rendering the ability to separate or combine is unclear. As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. As used herein, the term "plurality" denotes two or more. For example, a plurality of components indicates two or more components. The phrase "based on" does not mean "based only on," unless expressly specified otherwise. In other words, the phrase "based on" describes both "based only on" and "based at least on."

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A system for evaluating insulation-covered stator wire, comprising:
    a surface configured to support a continuous stator wire, wherein the surface comprises a length dimension extending along a longitudinal axis of the surface and a width dimension extending along a lateral direction of the surface, wherein the continuous stator wire comprises:
        at least one conductor shaped into a plurality of bent segments connected by a plurality of unbent segments, and
        an electrically insulating coating applied to portions of the plurality of bent segments and the plurality of unbent segments;
    an electrically conductive brush configured to contact the continuous stator wire prior to installing the stator wire in a stator, the electrically conductive brush configured to sweep over one or more of the plurality of bent segments of the stator wire and along the longitudinal axis of the surface at a constant height; and
    a power supply establishing an electrical current between the electrically conductive brush and an uninsulated end of the at least one conductor, wherein the electrical current changes when the electrically conductive brush contacts the conductor in a portion of the one or more plurality of bent segments comprising a defect in the electrically insulating coating.

2. The system of claim 1, wherein the defect comprises one of a crack in the electrically insulating coating, a variation in the thickness of the electrically insulating coating, bubbles in the electrically insulating coating, and particulates in the electrically insulating coating.

3. The system of claim 1, wherein the stator wire comprises a longitudinal axis extending in an x-axis direction, the stator wire further comprising a first plurality of bent segments on a first side of the longitudinal axis and a second plurality of bent segments on a second, opposing side of the longitudinal axis.

4. The system of claim 3, wherein the brush is configured to translate in the x-axis direction and sequentially contact each of a plurality of consecutive bent segments in the first plurality of bent segments of the stator wire.

5. The system of claim 4, further comprising a second electrically conductive brush configured to translate in the x-direction and sequentially contact each of a plurality of consecutive bent segments in the second plurality of bent segments of the stator wire, wherein the power supply is configured to establish an electrical current between the electrically conductive brushes and the uninsulated end of the conductor, and wherein the electrical current changes when either of the electrically conductive brushes contacts a portion comprising a defect in the electrically insulating coating.

6. The system of claim 1, further comprising a processor configured to compare a measured electrical current between the electrically conductive brush and the uninsulated end of the conductor when the brush contacts the portion comprising the defect to a reference electrical current to determine the change in electrical current.

7. The system of claim 1, further comprising a pulley-and-belt configured to sweep the brush along the longitudinal axis of the surface.

8. The system of claim 1, wherein the brush comprises two opposing non-contacting bristle portions configured to sweep over a top side and a bottom side of the one or more of the plurality of bent segments of the stator wire.

9. The system of claim 1, further comprising a second continuous stator wire positioned over the stator wire in a z-axis direction and offset from the stator wire in an x-axis direction, wherein the brush contacts each of a plurality of consecutive bent segments of the stator wire and each of a plurality of consecutive bent segments of the second stator wire as the brush sweeps along the longitudinal axis of the surface in the x-axis direction.

10. A method of detecting defects in insulation-covered stator wire, the method comprising:
    providing a surface configured to support a continuous stator wire, wherein the surface comprises a length dimension extending along a longitudinal axis of the surface and a width dimension extending along a lateral direction of the surface, wherein the continuous stator wire comprises
        at least one conductor shaped into a plurality of bent segments connected by a plurality of unbent segments, and
        an electrically insulating coating applied to portions of the plurality of bent segments and the plurality of unbent segments of the conductor;
    establishing an electrical current between an uninsulated end of the conductor and an electrically conductive brush;
    sweeping the brush over one or more of the plurality of bent segments of the continuous stator wire, the brush configured to contact the stator wire prior to installing the stator wire in a stator, the brush configured to sweep over one or more of the plurality of bent segments of the stator wire and along the longitudinal axis of the surface at a constant height; and detecting a change in the electrical current between the uninsulated end of the conductor and the brush when the brush contacts the at least one conductor in a portion of the one or more plurality of bent segments comprising a defect in the electrically insulating coating.

11. The method of claim 10, wherein the defect comprises one of a crack in the electrically insulating coating, a variation in the thickness of the electrically insulating coating, bubbles in the electrically insulating coating, and particulates in the electrically insulating coating.

12. The method of claim 10, wherein translating the brush comprises sequentially contacting the brush with each of a plurality of consecutive bent segments in a first plurality of bent segments of the stator wire.

13. The method of claim 10, further comprising establishing an electrical current between an uninsulated end of the conductor and a plurality of electrically conductive brushes, and further comprising simultaneously translating the plurality of electrically conductive brushes over one or more of the plurality of bent segments of the stator wire.

14. The method of claim 10, wherein detecting a change in the electrical current comprises comparing a measured electrical current between the brush and the uninsulated end of the conductor when the brush contacts the portion comprising the defect to a reference electrical current.

15. The method of claim 10, wherein a plurality of continuous stator wires are positioned over the continuous stator wire in a z-axis direction, and wherein the method further comprises:

simultaneously establishing an electrical current between uninsulated ends of all the conductors of the plurality of continuous stator wires and the brush;

translating the brush over a plurality of consecutive bent segments of the plurality of continuous stator wires;

detecting a change in the electrical current between the uninsulated end of at least one conductor and the brush when the brush contacts a portion of a stator wire that comprises a defect in the electrically insulating coating.

16. A system for detecting a defect in insulation-covered stator wire, comprising:

a first conductor;

a surface configured to support at least one continuous stator wire, wherein the surface comprises a length extending along a longitudinal axis of the surface and a width transverse to the length, wherein the at least one stator wire comprises at least one second conductor shaped into a plurality of bent segments connected by a plurality of unbent segments, and an electrically insulating coating applied to portions of the plurality of bent segments and the plurality of unbent segments of the conductor;

means for translating the first conductor over one or more of the plurality of bent segments of the at least one continuous stator wire, the first conductor configured to contact the at least one stator wire prior to installing the at least one stator wire in a stator, the first conductor configured to translate over one or more of the plurality of bent segments of the at least one stator wire and along the longitudinal axis of the surface at a height; and a power supply establishing an electrical current between the first conductor and an uninsulated end of the at least one second conductor, wherein the electrical current changes when the first conductor contacts the second conductor in a portion of the one or more plurality of bent segments comprising a defect in the electrically insulating coating.

17. The system of claim 16, wherein the first conductor comprises at least one of a bristle, a brush, a fiber, a woven cloth, and a non-woven cloth.

18. The system of claim 16, wherein the means for translating comprises a pulley-and-belt.

19. The system of claim 16, wherein the means for translating comprises a motor configured to translate a carriage comprising the first conductor.

20. The system of claim 16, wherein the at least one stator wire is positioned on a first surface of a test platform, and wherein the means for translating comprises a groove in a second surface of the test platform, the groove coupled to a carriage having the first conductor attached thereto.

* * * * *